US 12,336,156 B2

(12) United States Patent
Hanaoka

(10) Patent No.: US 12,336,156 B2
(45) Date of Patent: Jun. 17, 2025

(54) RADIO FREQUENCY MODULE AND COMMUNICATION DEVICE

(71) Applicant: Murata Manufacturing Co., Ltd., Kyoto (JP)

(72) Inventor: Kunitoshi Hanaoka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 199 days.

(21) Appl. No.: 18/366,008

(22) Filed: Aug. 7, 2023

(65) Prior Publication Data

US 2023/0380120 A1    Nov. 23, 2023

Related U.S. Application Data

(63) Continuation of application No. PCT/JP2022/002911, filed on Jan. 26, 2022.

(30) Foreign Application Priority Data

Feb. 18, 2021  (JP) .................. 2021-024663

(51) Int. Cl.
*H05K 9/00* (2006.01)
*H03H 9/00* (2006.01)
(Continued)

(52) U.S. Cl.
CPC ......... *H05K 9/0022* (2013.01); *H03H 9/0009* (2013.01); *H03H 9/02913* (2013.01);
(Continued)

(58) Field of Classification Search
CPC ........ H05K 1/02; H05K 1/0218; H05K 1/023; H05K 1/18; H05K 1/181–187;
(Continued)

(56) References Cited

U.S. PATENT DOCUMENTS 6,673,998 B1 *   1/2004  Wu ...................... H05K 9/0032
                                                              174/383
9,070,793 B2 *   6/2015  Liao .................... H01L 23/3121
(Continued)

FOREIGN PATENT DOCUMENTS

JP        S60-94891 U1    6/1985
JP        S60-181095 U1   12/1985
(Continued)

OTHER PUBLICATIONS

International Search Report for PCT/JP2022/002911 dated Apr. 19, 2022.

*Primary Examiner* — Tuan T Dinh
(74) *Attorney, Agent, or Firm* — McDonald Hopkins LLC

(57) ABSTRACT

The radio frequency module includes a mounting board, a first metal member, and a second metal member. The first metal member and the second metal member are disposed on the mounting board. The first metal member has a longitudinal direction along a first direction in plan view from a thickness direction of the mounting board. The second metal member has a longitudinal direction along a second direction in plan view from the thickness direction of the mounting board. The first or second metal member is placed between a first electronic component and a second electronic component. The first metal member has a first recessed portion. The second metal member has a through hole and a second recessed portion. The through hole passes through the second metal member in the direction intersecting with the second direction. The second recessed portion faces and is in contact with the first recessed portion.

20 Claims, 13 Drawing Sheets

(51) Int. Cl.
*H03H 9/02* (2006.01)
*H03H 9/05* (2006.01)
*H03H 9/10* (2006.01)
*H03H 9/64* (2006.01)
*H03H 9/72* (2006.01)
*H05K 1/02* (2006.01)
*H05K 1/18* (2006.01)

(52) U.S. Cl.
CPC .......... *H03H 9/0576* (2013.01); *H03H 9/059* (2013.01); *H03H 9/1085* (2013.01); *H03H 9/6483* (2013.01); *H03H 9/725* (2013.01); *H05K 1/023* (2013.01); *H05K 1/181* (2013.01); *H05K 2201/10015* (2013.01); *H05K 2201/1003* (2013.01); *H05K 2201/10053* (2013.01); *H05K 2201/1006* (2013.01); *H05K 2201/10371* (2013.01)

(58) Field of Classification Search
CPC ...... H05K 9/00; H05K 9/0022; H05K 9/0024; H05K 9/0032; H01L 23/00; H01L 23/02; H01L 23/284; H01L 23/498; H01L 23/19822; H01L 23/552; H01L 24/48
USPC .................. 361/782–784, 795, 816, 818; 257/660–690
See application file for complete search history.

(56) References Cited

U.S. PATENT DOCUMENTS

| | | |
|---|---|---|
| 2010/0044100 A1 | 2/2010 | Ono et al. |
| 2012/0320559 A1* | 12/2012 | Kimura ................. H01L 23/552 |
| | | 361/818 |
| 2013/0271928 A1 | 10/2013 | Shimamura et al. |
| 2018/0092257 A1 | 3/2018 | Otsubo et al. |
| 2020/0281102 A1* | 9/2020 | Otsubo ................ H05K 9/0024 |
| 2020/0343151 A1* | 10/2020 | Nomura ................. H01L 21/56 |
| 2021/0280503 A1 | 9/2021 | Sato et al. |
| 2023/0189490 A1* | 6/2023 | Hayashi ................. H01L 25/16 |
| | | 361/807 |

FOREIGN PATENT DOCUMENTS

| | | |
|---|---|---|
| JP | H06-97001 A | 4/1994 |
| JP | 2004-303752 A | 10/2004 |
| JP | 2012-159935 A | 8/2012 |
| JP | 2013-222829 A | 10/2013 |
| JP | 2015-159251 A | 9/2015 |
| WO | 2007/026499 A1 | 3/2007 |
| WO | 2016/181954 A1 | 11/2016 |
| WO | 2020/110578 A1 | 6/2020 |

* cited by examiner

RADIO FREQUENCY MODULE AND COMMUNICATION DEVICE

CROSS REFERENCE TO RELATED APPLICATION

This is a continuation of International Application No. PCT/JP2022/002911 filed on Jan. 26, 2022 which claims priority from Japanese Patent Application No. 2021-024663 filed on Feb. 18, 2021. The contents of these applications are incorporated herein by reference in their entireties.

BACKGROUND OF THE DISCLOSURE

Field of the Disclosure

The present disclosure relates generally to a radio frequency module and a communication device, and in more detail, to a radio frequency module in which a first electronic component and a second electronic component are disposed on a mounting board, and a communication device including the radio frequency module.

Description of the Related Art

A radio frequency module described in Patent Document 1 includes a wiring board, multiple components (a first electronic component and a second electronic component), a sealing resin layer (resin member), and a shield wall. The multiple components are mounted on the wiring board. The sealing resin layer seals the multiple components mounted on the wiring board. The shield wall is provided between the adjacent components in the sealing resin layer.

Patent Document 1: International Publication No. 2016/181954

BRIEF SUMMARY OF THE DISCLOSURE

In the radio frequency module described in Patent Document 1, the self-standing ability of the shield wall may be insufficient.

The present disclosure has been made in view of the above problem, and provides a radio frequency module and a communication device capable of improving the self-standing ability of a metal member placed between the multiple electronic components.

A radio frequency module according to an aspect of the present disclosure includes a mounting board, a first electronic component, a second electronic component, a first metal member, a second metal member, and a resin member. The mounting board has a first main surface and a second main surface facing each other. The first electronic component and the second electronic component are disposed on the first main surface of the mounting board. The first metal member and the second metal member are disposed on the first main surface of the mounting board. The resin member covers at least part of the first electronic component, the second electronic component, and the second metal member. The first metal member and the second metal member are grounded. The first metal member has a first longitudinal direction along a first direction in plan view from a thickness direction of the mounting board. The second metal member has a second longitudinal direction along a second direction intersecting with the first direction in plan view from the thickness direction of the mounting board. At least one of the first metal member and the second metal member is placed between the first electronic component and the second electronic component. The first metal member has a first recessed portion. The second metal member has a through hole and a second recessed portion. The through hole passes through the second metal member in a direction intersecting with the second direction. The second recessed portion faces and is in contact with the first recessed portion.

A communication device according to an aspect of the present disclosure includes the radio frequency module and a signal processing circuit. The signal processing circuit processes a radio frequency signal passing through the radio frequency module.

According to the present disclosure, the self-standing ability of the metal member placed between the multiple electronic components can be improved.

DETAILED DESCRIPTION OF THE DISCLOSURE

FIGS. 2 to 7 referred to in the following embodiment and modifications are all schematic diagrams, and the respective

Embodiment 1

A radio frequency module 1 and a communication device 500 according to an embodiment will be described below with reference to FIGS. 1 to 7.

(1) Overview

An overview of the radio frequency module 1 will be described with reference to FIGS. 2 to 4.

Figure 2:
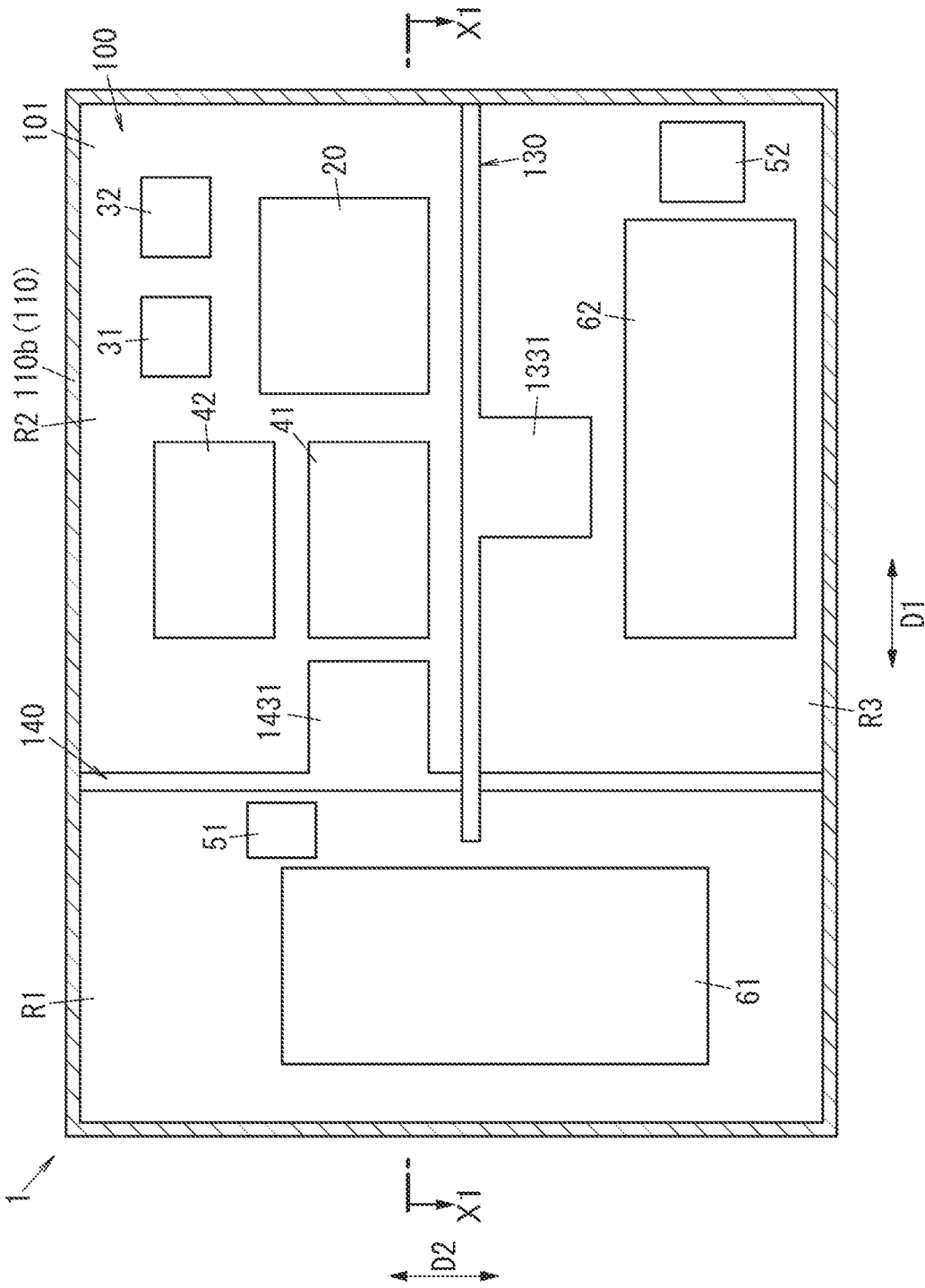
FIG. 2 is a plan view of the radio frequency module illustrated in FIG. 1.

As illustrated in FIG. 2, the radio frequency module 1 includes a mounting board 100, a first electronic component (e.g., a power amplifier 61) and a second electronic component (e.g., a transmit filter 41), a first metal member 130 and a second metal member 140, and a resin layer 120 (resin member). The mounting board 100 has a first main surface 101 and a second main surface 102 facing each other. The first electronic component and the second electronic component are disposed on the first main surface 101 of the mounting board 100. The first metal member 130 and the second metal member 140 are disposed on the first main surface 101 of the mounting board 100. The resin layer 120 covers at least part of the first electronic component, the second electronic component, and the second metal member 140 (see FIG. 3). In the example in FIG. 3, the resin layer 120 covers an entire first electronic component and an entire second electronic component, and covers portions of the second metal member 140 other than a first main surface 1431. The first main surface 1431 is a main surface on a side opposite to a mounting board 100 side of two main surfaces facing each other in a thickness direction D3 of the mounting board 100 in a contact portion 143 (described later) of the second metal member 140. At least one of the first metal member 130 and the second metal member 140 is grounded.

As illustrated in FIG. 2, the first metal member 130 has a first longitudinal direction along a first direction D1 in plan view from the thickness direction D3 (see FIG. 3) of the mounting board 100. The second metal member 140 has a second longitudinal direction along a second direction D2 intersecting with the first direction D1 in the plan view. That is, the second metal member 140 has a second longitudinal direction intersecting with both the first direction D1 and the thickness direction D3. The second metal member 140 is placed between the first electronic component (e.g., the power amplifier 61) and the second electronic component (e.g., the transmit filter 41).

Figure 4:
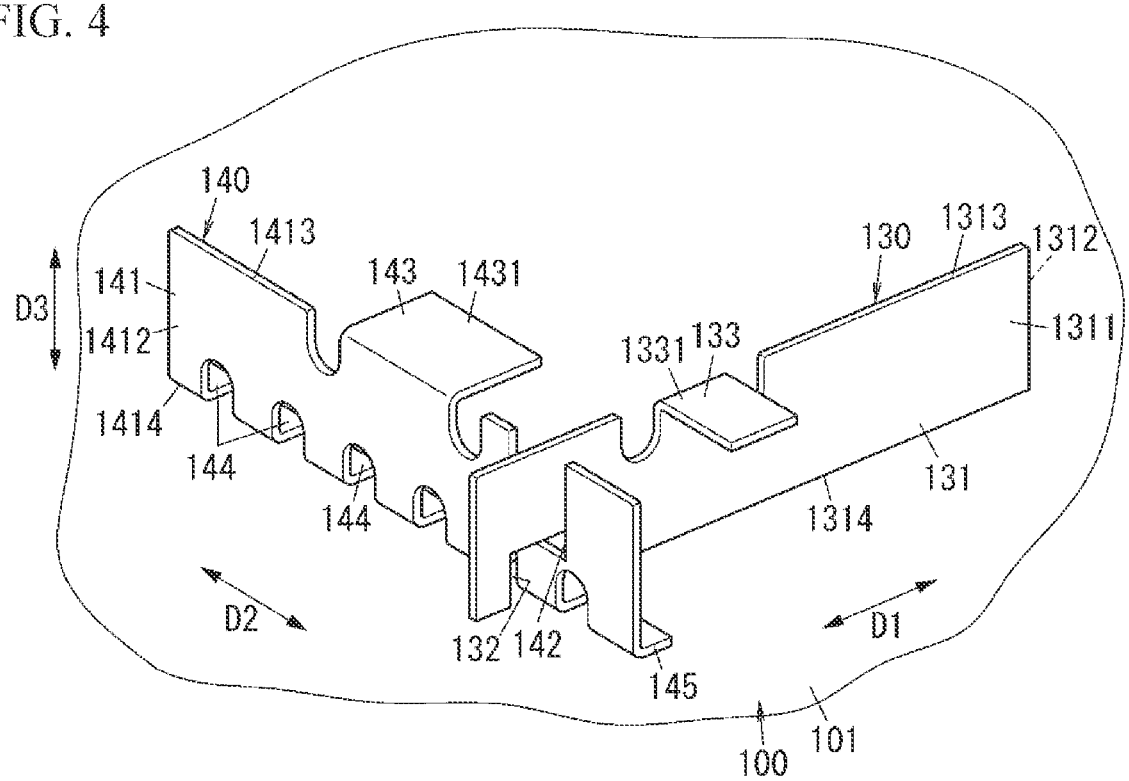
FIG. 4 is a perspective view of a first metal member and a second metal member included in the radio frequency module illustrated in FIGS. 1 to 3.

As illustrated in FIG. 4, the first metal member 130 has a first recessed portion 132. The second metal member 140 has a through hole 144 and a second recessed portion 142. The through hole 144 passes through the second metal member 140 in a direction (first direction D1) intersecting with (e.g., orthogonal to) the second direction D2. The second recessed portion 142 faces and is in contact with the first recessed portion 132.

According to this configuration, the first recessed portion 132 of the first metal member 130 and the second recessed portion 142 of the second metal member 140 face each other and are in contact with each other. Thus, the first metal member 130 and the second metal member 140 can support each other and stand on their own on the mounting board 100. Accordingly, the self-standing ability of the metal member (the first metal member 130 or the second metal member 140) placed between the first electronic component and the second electronic component can be improved.

(2) Configuration

Configurations of the radio frequency module 1 and the communication device 500 will be described below with reference to FIGS. 1 to 7.

(2-1) Example of Configuration of Communication Device

Figure 1:
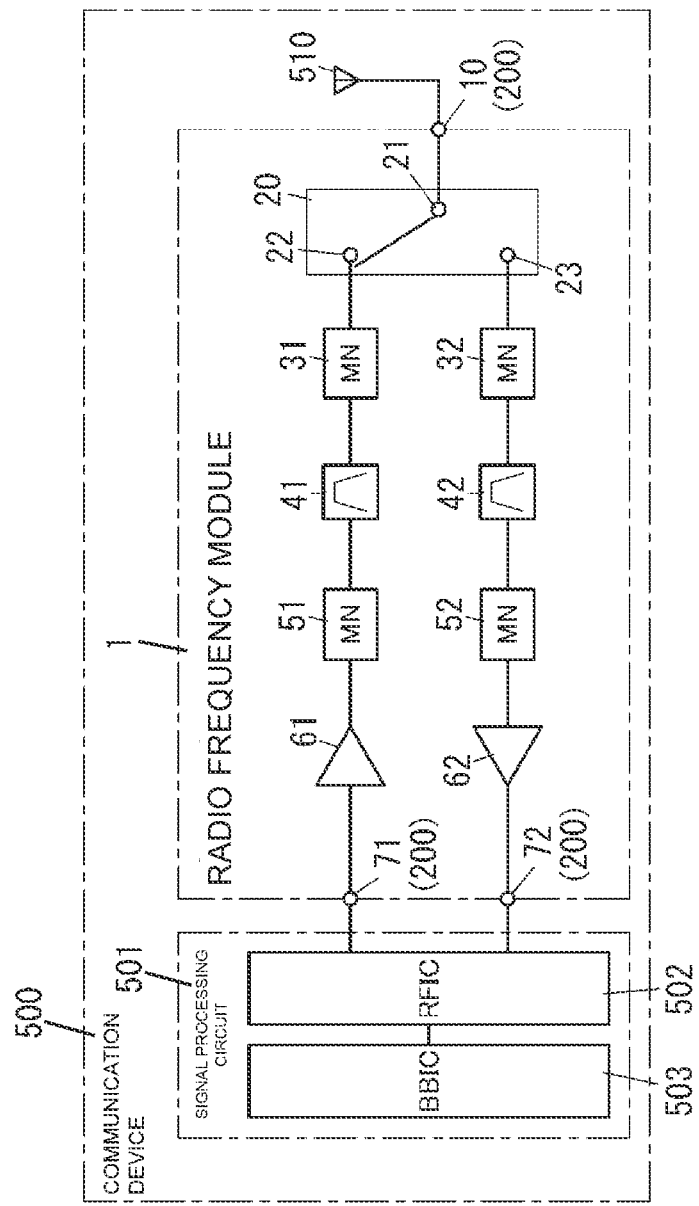
FIG. 1 is a schematic circuit diagram illustrating a radio frequency module according to an embodiment.

As illustrated in FIG. 1, the communication device 500 is, for example, a mobile phone (e.g., a smartphone), but is not limited thereto, and may be, for example, a wearable terminal (e.g., a smart watch). The radio frequency module 1 is a module that can support, for example, the fourth generation mobile communication (4G) standard and the fifth generation mobile communication (5G) standard. The 4G standard is, for example, the Third Generation Partnership Project (3GPP) Long Term Evolution (LTE) standard. The 5G standard is, for example, the 5G New Radio (NR) standard. The radio frequency module 1 is, for example, a module capable of supporting carrier aggregation and dual connectivity. Here, carrier aggregation and dual connectivity refer to communication that simultaneously use radio waves in multiple frequency bands.

The radio frequency module 1 is configured, for example, to amplify a transmit signal (radio frequency signal) inputted from a signal processing circuit 501 and output the amplified transmit signal to an antenna 510. The radio frequency module 1 is configured, for example, to amplify a receive signal (radio frequency signal) inputted from the antenna 510 and output the amplified receive signal to the signal processing circuit 501. The signal processing circuit 501 is not a component of the radio frequency module 1 but a component of the communication device 500 including the radio frequency module 1. The radio frequency module 1 is controlled by, for example, the signal processing circuit 501 included in the communication device 500. The communication device 500 includes the radio frequency module 1 and the signal processing circuit 501. The communication device 500 further includes the antenna 510. The communication device 500 further includes a circuit board (not illustrated) on which the radio frequency module 1 is mounted. The circuit board is, for example, a printed wiring board. The circuit board includes a ground electrode to which a ground potential is applied.

The signal processing circuit 501 processes signals (e.g., a receive signal and a transmit signal) passing through the radio frequency module 1. The signal processing circuit 501 includes, for example, an RF signal processing circuit 502 and a baseband signal processing circuit 503. The RF signal processing circuit 502 is, for example, a radio frequency integrated circuit (RFIC), and performs signal processing on radio frequency signals. The RF signal processing circuit 502, for example, performs signal processing such as up-conversion on a radio frequency signal (transmit signal) outputted from the baseband signal processing circuit 503, and outputs the signal-processed radio frequency signal. In addition, the RF signal processing circuit 502, for example, performs signal processing such as down-conversion on a radio frequency signal (receive signal) outputted from the radio frequency module 1, and outputs the signal-processed radio frequency signal to the baseband signal processing circuit 503.

The baseband signal processing circuit 503 is, for example, a baseband integrated circuit (BBIC). The baseband signal processing circuit 503 generates an I-phase signal and a Q-phase signal from a baseband signal. The baseband signal is, for example, an audio signal, an image signal, or the like inputted from the outside. The baseband signal processing circuit 503 performs IQ modulation processing by combining the I-phase signal and the Q-phase signal, and outputs a transmit signal. At this time, the transmit signal is generated as a modulated signal (IQ signal) obtained by amplitude-modulating a carrier signal having a predetermined frequency with a period longer than a period of the carrier signal. A receive signal processed by the baseband signal processing circuit 503 is used, for example, as an image signal for image display or as an audio signal for communication. The radio frequency module 1 according to Embodiment 1 transmits radio frequency signals (transmit signals and receive signals) between the antenna 510 and the RF signal processing circuit 502 of the signal processing circuit 501.

(2-2) Example of Circuit Configuration of Radio Frequency Module

As illustrated in FIG. 1, the radio frequency module 1 includes an antenna terminal 10, a switch 20, a first matching circuit 31, a second matching circuit 32, the transmit filter 41, a receive filter 42, a third matching circuit 51, a fourth matching circuit 52, the power amplifier 61, and a low noise amplifier 62. As illustrated in FIG. 1, the radio frequency module 1 further includes a signal input terminal 71 and a signal output terminal 72.

The antenna terminal 10 is electrically connected to the antenna 510.

The switch 20 is electrically connected to the antenna terminal 10. The switch 20 is electrically connected to the transmit filter 41 and the receive filter 42. Specifically, the switch 20 includes a common terminal 21 and multiple (two in the illustrated example) selection terminals 22 and 23. The switch 20 selects at least one of the multiple selection terminals 22 and 23 as a connection destination of the common terminal 21 under the control of the signal processing circuit 501. That is, the switch 20 selectively connects at least one of the transmit filter 41 and the receive filter 42 to the antenna 510. The common terminal 21 is electrically connected to the antenna terminal 10. That is, the common terminal 21 is electrically connected to the antenna 510 via the antenna terminal 10. The common terminal 21 is not limited to being directly connected to the antenna 510. A filter, a coupler, or the like may be provided between the common terminal 21 and the antenna 510. The selection terminal 22 is electrically connected to the transmit filter 41. The selection terminal 23 is electrically connected to the receive filter 42.

The first matching circuit 31 is, for example, at least one of an inductor and a capacitor. The first matching circuit 31 is connected in a transmit path between the switch 20 and the transmit filter 41, and matches the impedance between the switch 20 and the transmit filter 41. The second matching circuit 32 is connected in a receive path between the selection terminal 23 of the switch 20 and the receive filter 42, and matches the impedance between the switch 20 and the receive filter 42.

The transmit filter 41 is a filter that passes transmit signals in a predetermined frequency band inputted from the signal processing circuit 501. The transmit filter 41 is, for example, a ladder filter, and includes multiple (e.g., four) series arm resonators and multiple (e.g., three) parallel arm resonators. The transmit filter 41 is, for example, an acoustic wave filter. In the acoustic wave filter, each of the multiple series arm resonators and the multiple parallel arm resonators is constituted of an acoustic wave resonator. The acoustic wave filter is, for example, a surface acoustic wave filter that uses surface acoustic waves. In the surface acoustic wave filter, each of the multiple series arm resonators and the multiple parallel arm resonators is, for example, a surface acoustic wave (SAW) resonator.

The transmit filter 41 is electrically connected to the switch 20 via the first matching circuit 31. An input terminal of the transmit filter 41 is electrically connected to the third matching circuit 51, and an output terminal of the transmit filter 41 is electrically connected to the first matching circuit 31.

The receive filter 42 is a filter that passes receive signals in a predetermined frequency band received by the antenna 510. The receive filter 42 is, for example, a ladder filter, and includes multiple (e.g., four) series arm resonators and multiple (e.g., three) parallel arm resonators. The receive filter 42 is, for example, an acoustic wave filter. In the acoustic wave filter, each of the multiple series arm resonators and the multiple parallel arm resonators is constituted of an acoustic wave resonator. The acoustic wave filter is, for example, a surface acoustic wave filter that uses surface acoustic waves. In the surface acoustic wave filter, each of the multiple series arm resonators and the multiple parallel arm resonators is, for example, a SAW resonator.

The receive filter 42 is electrically connected to the switch 20 via the second matching circuit 32. An input terminal of the receive filter 42 is electrically connected to the second matching circuit 32, and an output terminal of the receive filter 42 is electrically connected to the fourth matching circuit 52.

The third matching circuit 51 is electrically connected in a path between the transmit filter 41 and the power amplifier 61, and matches the impedance between the transmit filter 41 and the power amplifier 61. The fourth matching circuit 52 is electrically connected in a path between the receive filter 42 and the low noise amplifier 62, and matches the impedance between the receive filter 42 and the low noise amplifier 62.

The power amplifier 61 amplifies a transmit signal. An input terminal of the power amplifier 61 is electrically connected to the signal input terminal 71. An output terminal of the power amplifier 61 is electrically connected to the third matching circuit 51.

The low noise amplifier 62 amplifies a receive signal. An input terminal of the low noise amplifier 62 is electrically connected to the fourth matching circuit 52, and an output terminal of the low noise amplifier 62 is electrically connected to the signal output terminal 72. The signal input terminal 71 is connected to the RF signal processing circuit 502. That is, the power amplifier 61 is electrically connected to the RF signal processing circuit 502 via the signal input terminal 71.

The signal output terminal 72 is connected to the RF signal processing circuit 502. That is, the low noise amplifier 62 is electrically connected to the RF signal processing circuit 502 via the signal output terminal 72.

(2-3) Example of Configuration (Structure) of Radio Frequency Module

The radio frequency module 1 further includes the mounting board 100, the first metal member 130, and the second metal member 140 (see FIG. 2). The radio frequency module 1 further includes multiple (two in the illustrated example) external connection terminals 200, the resin layer 120 (resin member), and a shield layer 110 (see FIG. 3).

Figure 3:
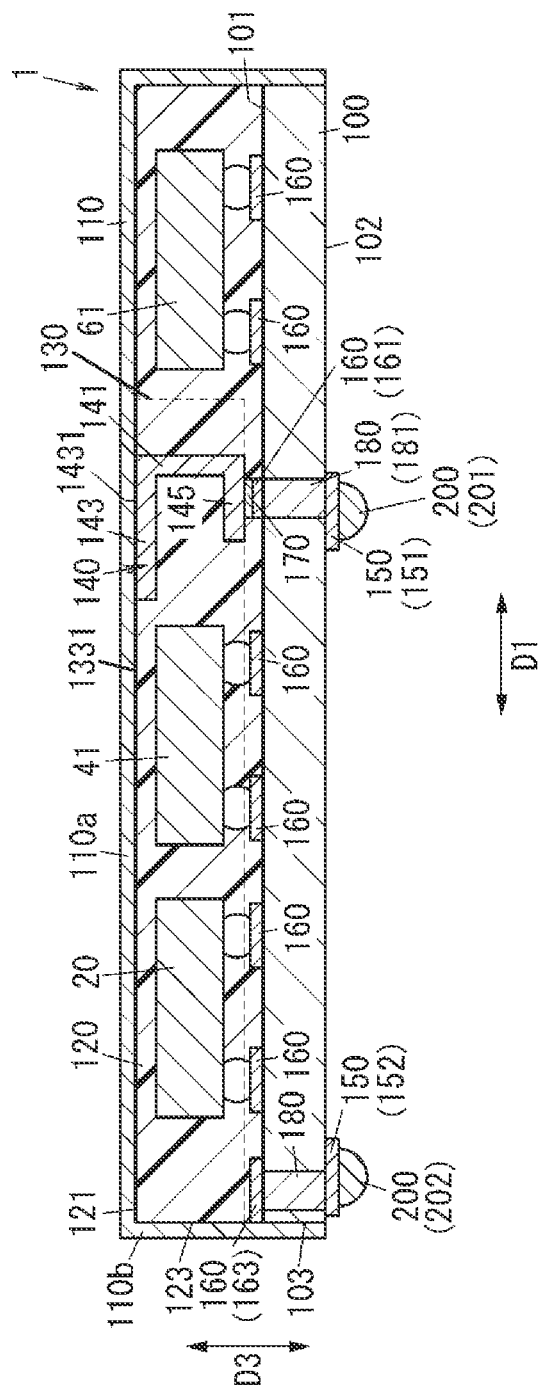
FIG. 3 is a sectional view taken along line X1-X1 in FIG. 2.

As illustrated in FIG. 3, the mounting board 100 has the first main surface 101 and the second main surface 102 facing each other in the thickness direction D3 of the mounting board 100. The mounting board 100 includes multiple (two in the illustrated example) first pads 150 and multiple (eight in the illustrated example) second pads 160.

The mounting board 100 is, for example, a printed wiring board, a low temperature co-fired ceramics (LTCC) board, a high temperature co-fired ceramics (HTCC) board, or a resin multilayer board. Here, the mounting board 100 is, for example, a multilayer board including multiple dielectric layers and multiple conductive layers, and is a ceramic board. The multiple dielectric layers and the multiple conductive layers are stacked in the thickness direction D3 of the mounting board 100. The multiple conductive layers are formed in predetermined patterns determined for the respective layers. Each of the multiple conductive layers includes one or more conductive portions in one plane orthogonal to the thickness direction D3 of the mounting board 100. A material of each conductive layer is, for example, copper. A ground layer is one of the multiple conductive layers. In the radio frequency module 1, one or more ground terminals of the multiple external connection terminals 200 are electrically connected to the ground layer through via conductors 180, the first pads 150, and the like included in the mounting board 100. In FIG. 3, two ground terminals 201 and 202 of the multiple ground terminals are electrically connected to the ground layer.

The mounting board 100 is not limited to a printed wiring board or an LTCC board, and may be a wiring structure. The wiring structure is, for example, a multilayer structure. The multilayer structure includes at least one insulating layer and at least one conductive layer. The insulating layer is formed in a predetermined pattern. When there are multiple insulating layers, the multiple insulating layers are formed in predetermined patterns determined for the respective layers. The conductive layer is formed in a predetermined pattern different from the predetermined pattern of the insulating layer. When there are multiple conductive layers, the multiple conductive layers are formed in predetermined patterns determined for the respective layers. The conductive layers may include one or more redistribution portions. In the wiring structure, of two surfaces facing each other in a thickness direction of the multilayer structure, a first surface is the first main surface 101 of the mounting board 100, and a second surface is the second main surface 102 of the mounting board 100. The wiring structure may be, for example, an interposer. The interposer may be an interposer using a silicon substrate or may be a substrate formed of multiple layers.

The first main surface 101 and the second main surface 102 of the mounting board 100 are separated from each other in the thickness direction D3 of the mounting board 100 and intersect with the thickness direction D3 of the mounting board 100. The first main surface 101 in the mounting board 100 is, for example, orthogonal to the thickness direction D3 of the mounting board 100, but may include, for example, a side surface of a conductive portion as a surface not orthogonal to the thickness direction D3. The second main surface 102 in the mounting board 100 is, for example, orthogonal to the thickness direction D3 of the mounting board 100, but may include, for example, a side surface of a conductive portion as a surface not orthogonal to the thickness direction D3. In addition, the first main surface 101 and the second main surface 102 of the mounting board 100 may have fine irregularities, concave portions, or convex portions. In plan view from the thickness direction D3 of the mounting board 100, the mounting board 100 has a rectangular shape, but the shape is not limited thereto and the mounting board 100 may have a square shape, for example.

As illustrated in FIG. 2, the radio frequency module 1 includes the switch 20, the first matching circuit 31, the second matching circuit 32, the transmit filter 41, the receive filter 42, the third matching circuit 51, the fourth matching circuit 52, the power amplifier 61, and the low noise amplifier 62 as the multiple electronic components. The multiple electronic components are each mounted on the first main surface 101 or the second main surface 102 of the mounting board 100. In the embodiment, the multiple electronic components of the radio frequency module 1 are each mounted on the first main surface 101.

In more detail, as illustrated in FIG. 2, on the first main surface 101, the mounting board 100 has three regions R1, R2, and R3. The region R1 is a region on the first main surface 101 on one end side in the first direction D1 (left end side of the paper) and extending entirely in the second direction D2. The power amplifier 61 and the matching circuit 51 are disposed in the region R1. The region R2 is a substantially half region on one end side in the second direction D2 (top side of the paper) in a region closer to another end side in the first direction D1 (right end of the paper) than the region R1 on the first main surface 101. The transmit filter 41, the receive filter 42, the switch 20, and the matching circuits 31 and 32 are disposed in the region R2. In more detail, the transmit filter 41 and the receive filter 42 are disposed side by side along the second direction D2 in a region on one end side (left end side of the paper) in the first direction D1 in the region R2. The switch 20 is placed in the region R2 on another end side in the first direction D1 (right end side of the paper) and on another end side in the second direction D2 (bottom side of the paper). The matching circuits 31 and 32 are disposed closer to the one end side (top side of the paper) in the second direction D2 than the switch 20 in the region R2. The region R3 is a region closer to another end side (bottom side of the paper) in the second direction D2 than the region R2 in the region closer to the other end side (right end side of the paper) in the first direction D1 than the region R1 on the first main surface 101. The low noise amplifier 62 and the matching circuit 52 are disposed in the region R3.

As illustrated in FIG. 3, the multiple external connection terminals 200 are disposed on the second main surface 102. In more detail, the multiple external connection terminals 200 are located on the second main surface 102 of the mounting board 100 via the first pads 150, respectively. A material of the multiple external connection terminals 200 is, for example, metal (e.g., copper or a copper alloy). Each of the multiple external connection terminals 200 is a solder bump.

The antenna terminal 10, one or more ground terminals, the signal input terminal 71, and the signal output terminal 72 (see FIG. 1) are the external connection terminals 200. The one or more ground terminals are connected to the ground layer of the mounting board 100 as described above. The ground layer is a circuit ground of the radio frequency module 1, and some of the multiple electronic components of the radio frequency module 1 are electronic components connected to the ground layer.

The resin layer 120 (resin member) is provided on the first main surface 101 of the mounting board 100. The resin layer 120 covers the first main surface 101 of the mounting board 100. The resin layer 120 covers the multiple electronic components (including the first electronic component and the second electronic component) disposed on the first main surface 101 of the mounting board 100. The resin layer 120 covers at least part of the first metal member 130 (e.g., portions other than a first main surface 1331 (see FIG. 4)) and at least part of the second metal member 140 (e.g., portions other than the first main surface 1431). The first main surface 1331 is a main surface on the side opposite to the mounting board 100 side of two main surfaces facing each other in the thickness direction D3 of the mounting board 100 in a contact portion 133 (described later) of the first metal member 130. The first main surface 1431 is a main surface on the side opposite to the mounting board 100 side of two main surfaces facing each other in the thickness direction D3 of the mounting board 100 in a contact portion 143 (described later) of the second metal member 140. Here, the resin layer 120 seals the multiple electronic components disposed on the first main surface 101 of the mounting board 100. The resin layer 120 seals portions of the first metal member 130 and the second metal member 140 disposed on the first main surface 101 of the mounting board 100, other than at least the above-described portions (the first main surfaces 1331 and 1431). The resin layer 120 contains resin (e.g., epoxy resin). The resin layer 120 may contain fillers in addition to the resin.

The shield layer 110 is provided on the resin layer 120 and covers at least part of the resin layer 120. In the embodiment, the shield layer 110 covers a first main surface 121 and an outer surface 123 of the resin layer 120. The first main surface 121 is a main surface of the resin layer 120 on the side opposite to the mounting board 100 side. In more detail, the shield layer 110 has a first shield portion 110a and a second shield portion 110b. The first shield portion 110a is provided on the first main surface 121 of the resin layer 120 and at least partially (e.g., entirely) covers the first main surface 121. The second shield portion 110b is provided on the outer surface 123 (side surface) of the resin layer 120 and at least partially (e.g., entirely) covers the outer surface 123. The shield layer 110 covers at least part of the first metal member 130 (e.g., the first main surface 1331 (see FIG. 4)) and at least part of the second metal member 140 (e.g., the first main surface 1431).

The shield layer 110 has conductivity. The shield layer 110 has a multilayer structure in which multiple metal layers are stacked, but is not limited to having multiple metal layers, and may have a single metal layer. The metal layer contains one or more metals. The shield layer 110 covers the first main surface 121 and the outer surface 123 of the resin layer 120, an outer surface 103 of the mounting board 100, the first main surface 1331 (see FIG. 4) of the first metal member 130, and the first main surface 1431 of the second metal member 140. The shield layer 110 is electrically connected to a second pad 163 among the multiple second pads 160 included in the mounting board 100. The second pad 163 is electrically connected to a first pad 152 of the multiple first pads 150 through the via conductor 180. The first pad 152 is electrically connected to the external connection terminal 200, which is a ground terminal 202. Thus, a potential of the shield layer 110 can be made equal to a potential of the ground layer. That is, the shield layer 110 can be grounded.

As illustrated in FIG. 2, the first metal member 130 and the second metal member 140 are disposed between the multiple electronic components on the first main surface 101 of the mounting board 100. Accordingly, the isolation between the multiple electronic components is ensured. The first metal member 130 and the second metal member 140 are made of a metal material (i.e., conductive material) and are each formed, for example, in a flat plate shape. The first metal member 130 and the second metal member 140 are disposed so as to intersect with (e.g., orthogonal to) each other in plan view from the thickness direction D3 of the mounting board 100. The first metal member 130 is placed along a boundary between the region R2 and the region R3, and extends in the first direction D1. That is, the first metal member 130 is placed between both the transmit filter 41 and the switch 20 and the low noise amplifier 62. Thus, the first metal member 130 ensures the isolation between both the transmit filter 41 and the switch 20 and the low noise amplifier 62. The second metal member 140 is placed along a boundary between the region R1 and the regions R2 and R3, and extends in the second direction D2. That is, the second metal member 140 is placed between the power amplifier 61 and the transmit filter 41, the receive filter 42, and the low noise amplifier 62. Thus, the second metal member 140 ensures the isolation between the power amplifier 61 and the transmit filter 41, the receive filter 42, and the low noise amplifier 62, for example.

In the example in FIG. 2, the first metal member 130 is placed between both the transmit filter 41 (second electronic component) and the switch 20 and the low noise amplifier 62 (third electronic component). The second metal member 140 is placed between the power amplifier 61 (first electronic component) and both the transmit filter 41 (second electronic component) and the low noise amplifier 62. However, the second metal member 140 may be placed between both the transmit filter 41 (second electronic component) and the switch 20 and the low noise amplifier 62 (third electronic component). Also, the first metal member 130 may be placed between the power amplifier 61 (first electronic component) and both the transmit filter 41 (second electronic component) and the low noise amplifier 62. At least one of the first metal member 130 and the second metal member 140 may be placed between the first electronic component (e.g., the power amplifier 61) and the second electronic component (e.g., the transmit filter 41).

As illustrated in FIG. 3, the second metal member 140 is electrically connected to a second pad 161 among the multiple second pads 160 of the mounting board 100 via solder 170. The second pad 161 is electrically connected to a first pad 151 of the multiple first pads 150 through a via conductor 181 (180). The first pad 151 is electrically connected to the external connection terminal 200, which is the ground terminal 201. That is, the second metal member 140 is grounded. Thus, a potential of the second metal member 140 is equal to the potential of the ground layer. Similar to the second metal member 140, the first metal member 130 is also grounded by being electrically connected to the second pad of the mounting board 100. Thus, in the embodiment, both the first metal member 130 and the second metal member 140 are grounded. However, at least one of the first metal member 130 and the second metal member 140 may be grounded. That the first metal member 130 and the second metal member 140 are grounded means that the first metal member 130 and the second metal member 140 are electrically grounded.

The second metal member 140 has the first main surface 1431. The first main surface 1431 is a main surface in the contact portion 143 (described later) of the second metal member 140 on the side opposite to the mounting board 100 side. The first main surface 1431 of the second metal member 140 is in electrical contact with the shield layer 110

(see FIG. 3). Both ends in the second metal member 140 in the second direction D2 (e.g., both upper and lower ends on the paper) are in electrical contact with the shield layer 110 (see FIG. 2). Thus, the second metal member 140 is in electrical contact with the shield layer 110 at the first main surface 1331 and both end portions in the second direction D2. Thus, the second metal member 140 is grounded not only through the electrical connection to the second pad 161, but also through the shield layer 110. Similar to the second metal member 140, the first metal member 130 is also in electrical contact with the shield layer 110 at the first main surface 1331 and one end portion in the first direction D1. Thus, the first metal member 130 is also grounded not only through the electrical connection to the second pad (not illustrated), but also through the shield layer 110.

(2-4) Shapes of First Metal Member and Second Metal Member

Shapes of the first metal member 130 and the second metal member 140 will be described with reference to FIGS. 4 to 7.

(2-4-1) Shape of First Metal Member

Figure 5:
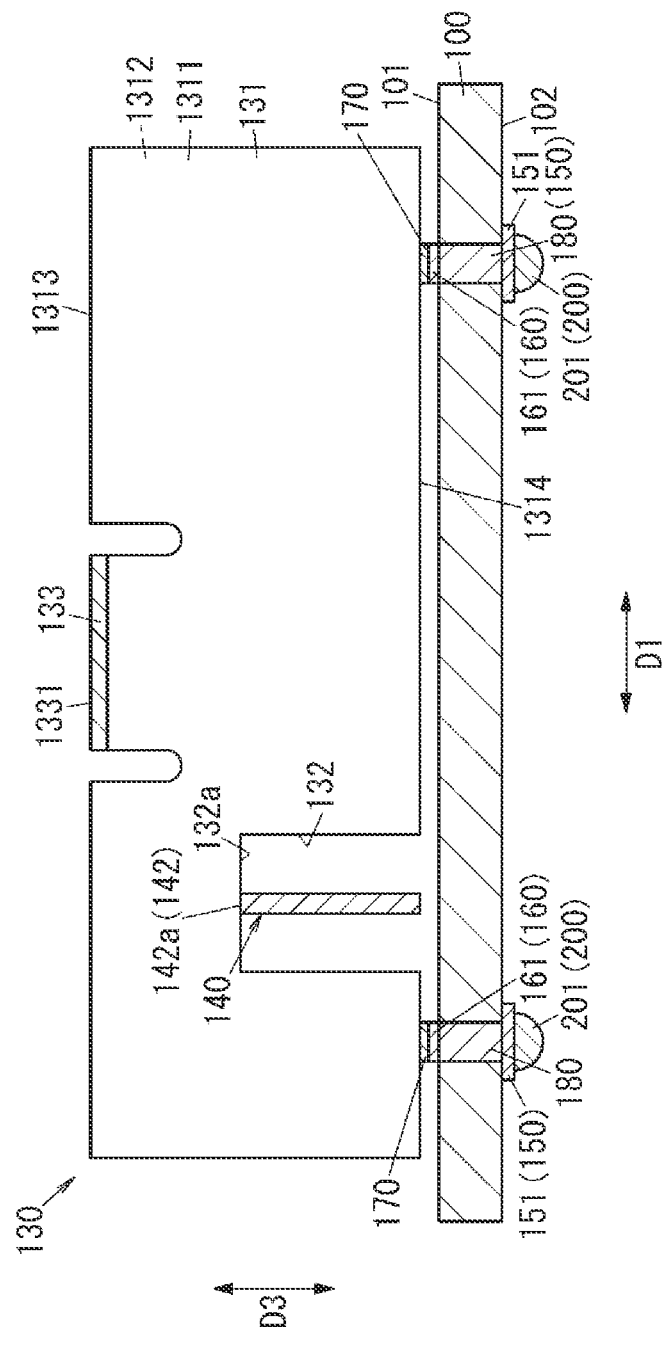
FIG. 5 is a sectional view of the first metal member illustrated in FIG. 4.

As illustrated in FIGS. 4 and 5, the first metal member 130 has, for example, a substantially flat plate shape. The first metal member 130 extends in the first direction D1. That is, the first metal member 130 has a longitudinal direction (first longitudinal direction) along the first direction D1 in plan view from the thickness direction D3 of the mounting board 100. The first metal member 130 has a wall portion 131 and one or more contact portions 133 (one contact portion in FIGS. 4 and 5).

The wall portion 131 is a main body (i.e., a base portion) of the first metal member 130. The wall portion 131 has a rectangular plate shape having two main surfaces 1311 and 1312 facing each other in the second direction D2. The wall portion 131 is placed on the first main surface 101 of the mounting board 100 such that a lateral direction of a main surface 1311 coincides with the thickness direction D3 of the mounting board 100 and a longitudinal direction of the main surface 1311 (i.e., the longitudinal direction of the first metal member 130) is parallel to the first main surface 101 of the mounting board 100. In the example illustrated in FIGS. 4 and 5, the longitudinal direction of the main surface 1311 of the wall portion 131 coincides with the first direction D1.

The contact portion 133 is a portion that is in contact with a back surface of the first shield portion 110a (see FIG. 3) of the shield layer 110. This contact electrically connects the first metal member 130 to the shield layer 110. The contact portion 133 has, for example, a rectangular flat plate shape. The contact portion 133 is provided at, for example, the center in the longitudinal direction (the first direction D1) at a top portion 1313 of the wall portion 131. The contact portion 133 protrudes from the top portion 1313 in one direction (e.g., the main surface 1311 side) of the thickness direction (the second direction D2) of the wall portion 131. A main surface in the contact portion 133 on the side opposite to the mounting board 100 side is the first main surface 1331 that is in contact with the back surface of the first shield portion 110a of the shield layer 110. The top portion 1313 is an end portion in the wall portion 131 on the side opposite to the mounting board 100 side.

The first metal member 130 has the first recessed portion 132. The first recessed portion 132 is a portion that fits into (i.e., faces and is in contact with) the second recessed portion 142 of the second metal member 140. The first recessed portion 132 has, for example, a rectangular shape in plan view from the thickness direction (the second direction D2) of the wall portion 131. The first recessed portion 132 is provided at a portion where the first metal member 130 intersects with the second metal member 140 in plan view from the thickness direction D3 of the mounting board 100. In more detail, the first recessed portion 132 is formed so as to be recessed toward a top portion 1313 side of the wall portion 131 at the intersection at a base end portion 1314 of the wall portion 131. The first recessed portion 132 and the second recessed portion 142 are fitted to each other such that a bottom portion 132a of the first recessed portion 132 and a bottom portion 142a of the second recessed portion 142 face each other. The first recessed portion 132 is formed so as to pass through the wall portion 131 in the thickness direction of the wall portion 131. The base end portion 1314 is an end portion in the wall portion 131 on the mounting board 100 side.

In the first metal member 130, the base end portion 1314 of the wall portion 131 is a portion to be connected to the second pad 160 provided on the first main surface 101 of the mounting board 100 by solder, for example. By connecting at least part of the base end portions 1314 of the wall portion 131 to the second pad 160, the first metal member 130 is electrically connected to the second pad 160.

(2-4-2) Shape of Second Metal Member

Figure 6:
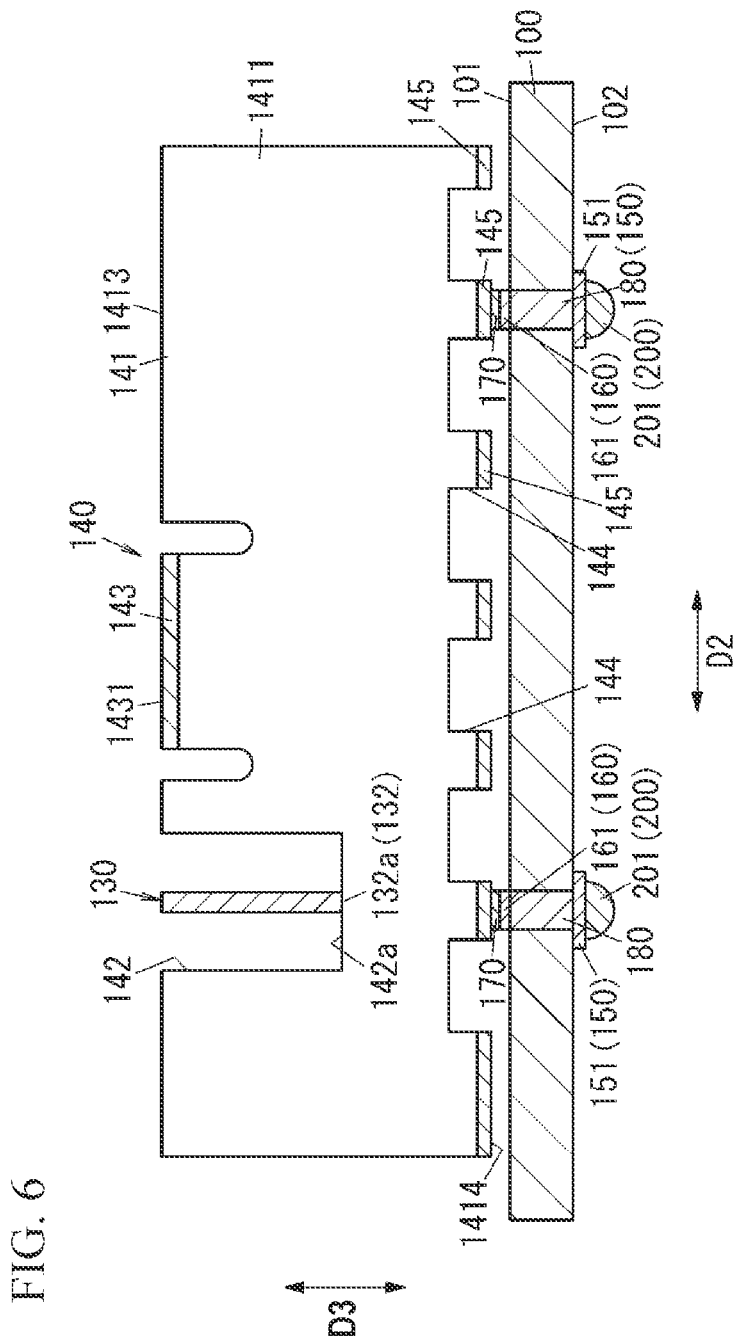
FIG. 6 is a sectional view of the second metal member illustrated in FIG. 4.

As illustrated in FIGS. 4 and 6, the second metal member 140 has, for example, a substantially flat plate shape. The second metal member 140 extends in the second direction D2 intersecting with the first direction D1. That is, the second metal member 140 has a longitudinal direction (second longitudinal direction) along the second direction D2 in plan view from the thickness direction D3 of the mounting board 100. The second metal member 140 has a wall portion 141, one or more contact portions 143 (one contact portion in FIGS. 4 and 6), and multiple connection portions 145.

The wall portion 141 is a main body (i.e., a base portion) of the second metal member 140. The wall portion 141 has a rectangular plate shape having two main surfaces 1411 and 1412 facing each other. The wall portion 141 is placed on the first main surface 101 of the mounting board 100 such that a lateral direction of the main surface 1411 coincides with the thickness direction D3 of the mounting board 100 and a longitudinal direction of the main surface 1411 (i.e., the longitudinal direction of the second metal member 140) is parallel to the first main surface 101 of the mounting board 100. In the example illustrated in FIGS. 4 and 6, the longitudinal direction of the main surface 1411 of the wall portion 141 coincides with the second direction D2.

The contact portion 143 is a portion that is in contact with the back surface of the first shield portion 110a of the shield layer 110. This contact electrically connects the first metal member 140 to the shield layer 110. The contact portion 143 has, for example, a rectangular flat plate shape. The contact portion 143 is provided at a predetermined position (e.g., the center or a position shifted from the center) in the longitudinal direction (the second direction D2) at a top portion 1413 of the wall portion 141. The contact portion 143 protrudes from the top portion 1413 in one direction (e.g., the main surface 1411 side) in the thickness direction (the first direction D1) in the wall portion 141. A main surface in the contact portion 143 on the side opposite to the mounting board 100 side is the first main surface 1431 that is in contact with the back surface of the first shield portion 110a of the shield layer 110. The top portion 1413 is an end portion in the wall portion 141 on the side opposite to the mounting board 100 side.

The multiple connection portions 145 are portions to be connected to the second pads 160 provided on the first main surface 101 of the mounting board 100. At least one of the multiple connection portions 145 is connected to the second pad 161. The connection portion 145 is connected to the second pad 161 by solder, for example. This connection electrically connects the first metal member 140 to the second pad 161. The connection portion 145 has, for example, a rectangular flat plate shape. The multiple connection portions 145 are spaced apart from each other along the longitudinal direction (the second direction D2) of the wall portion 141 at a base end portion 1414 of the wall portion 141. The contact portion 145 protrudes from the base end portion 1414 of the wall portion 141 in one direction (e.g., the main surface 1411 side) in the thickness direction (the first direction D1) of the wall portion 141. In the embodiment, the connection portions 145 protrude on the same side as the contact portion 143, but may protrude on a side opposite to the side on which the contact portion 143 protrudes. The base end portion 1414 is an end portion of the wall portion 141 on the mounting board 100 side.

The second metal member 140 has the second recessed portion 142 and one or more (multiple in the example in FIGS. 4 and 6) through holes 144.

The second recessed portion 142 is a portion that fits into (i.e., faces and is in contact with) the first recessed portion 132 of the first metal member 130. The second recessed portion 142 has, for example, a rectangular shape in plan view from the thickness direction (the first direction D1) of the wall portion 141. The second recessed portion 142 is provided in the second metal member 140 at a portion where the second metal member 140 intersects with the first metal member 130 in plan view from the thickness direction D3 of the mounting board 100. In more detail, the second recessed portion 142 is formed so as to be recessed toward the base end portion 1414 side of the wall portion 141 at the intersection at the top portion 1413 of the wall portion 141. The second recessed portion 142 is formed so as to pass through the wall portion 141 in the thickness direction (the first direction D1) of the wall portion 141. The first recessed portion 132 and the second recessed portion 142 are fitted to each other such that the bottom portion 132a of the first recessed portion 132 and the bottom portion 142a of the second recessed portion 142 face each other.

The through hole 144 allows air to pass therethrough when reflow-connecting the connection portion 145 to the second pad 160. The through hole 144 allows a liquid material, which is a material of the resin layer 120, to pass therethrough when the liquid material is applied to the mounting board 100 before curing. Passage of the air and the liquid material through the through hole 144 prevents the second metal member 140 from tilting or falling down due to the flow of the air and the liquid material.

The multiple through holes 144 are spaced apart from each other along the longitudinal direction (the second direction D2) of the wall portion 141 at the base end portion 1414 of the wall portion 141. The multiple through holes 144 are respectively disposed between the multiple contact portions 143. The through hole 144 has, for example, a rectangular shape in plan view from the thickness direction (first direction D1) of the wall portion 141. The through hole 144 is formed at an edge of the wall portion 141 on the base end portion 1414 side so as to pass through the wall portion 141 in the thickness direction (the first direction D1). The thickness direction (the first direction D1) of the wall portion 141 is a direction intersecting with (e.g., orthogonal to) the second direction D2. That is, the through hole 144 passes through in a direction intersecting with the second direction D2. The through hole 144 extends from the main surfaces 1411 to 1412 on both sides of the wall portion 141. The through hole 144 is open at the base end portion 1414. That is, the through hole 144 is recessed from the base end portion 1414 toward the top portion 1413 side in the wall portion 141. In other words, on the main surface 1411 of the wall portion 141, a contour of the opening of the through hole 144 is open at the base end portion 1414 of the wall portion 141. In the embodiment, the through hole 144 is open at the base end portion 1414 of the wall portion 141, but may be closed at the base end portion 1414. In other words, on the main surface 1411 of the wall portion 141, the contour of the opening of the through hole 144 may be closed.

(2-4-3) Method of Assembling First Metal Member and Second Metal Member

Figure 7:
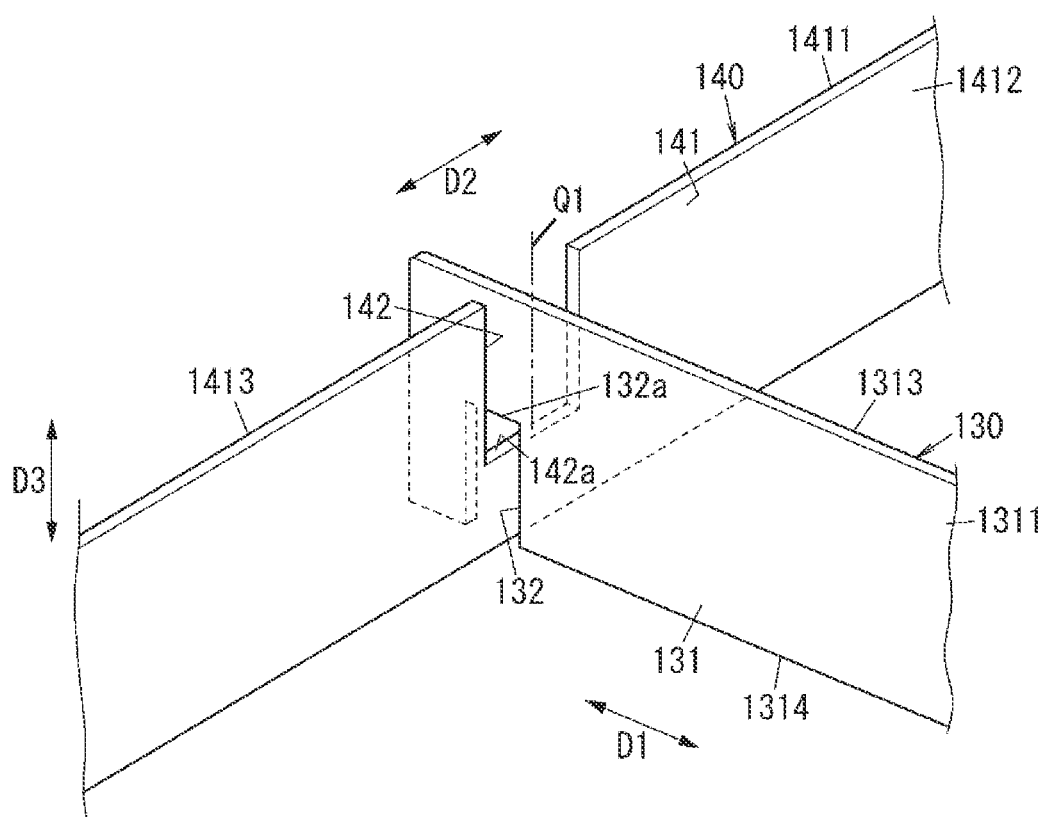
FIG. 7 is a schematic enlarged view illustrating an intersection of the first metal member and the second metal member and its surroundings.

As illustrated in FIG. 7, in plan view from the thickness direction D3 of the mounting board 100, the first metal member 130 and the second metal member 140 are assembled so as to intersect with (e.g., be orthogonal to) each other. In FIG. 7, the contact portion 133 of the first metal member 130 is not illustrated. In FIG. 7, the contact portion 143, the through holes 144, and the connection portions 145 of the second metal member 140 are not illustrated.

In the assembled state, the first recessed portion 132 of the first metal member 130 and the second recessed portion 142 of the second metal member 140 are fitted to each other while intersecting with each other in the plan view. That is, the first recessed portion 132 and the second recessed portion 142 face each other and are in contact with each other while intersecting with each other in plan view from the thickness direction D3 of the mounting board 100. "The first recessed portion 132 and the second recessed portion 142 are in contact with each other" includes "part of the first recessed portion 132 and part of the second recessed portion 142 are in contact with each other", "part of the first recessed portion 132 and part of the second metal member 140 are in contact with each other", and "part of the first metal member 130 and part of the second recessed portion 142 are in contact with each other".

In the assembled state, the first metal member 130 can be tilted within a range of an opening width of the second recessed portion 142 of the second metal member 140 in the second direction D2 (hereinafter, simply referred to as "opening width"). Thus, the first metal member 130 can stand on its own while tilting within the range of the opening width of the second recessed portion 142. Similarly, the second metal member 140 can be tilted within a range of an opening width of the first recessed portion 132 of the first metal member 130 in the first direction D1 (hereinafter, simply referred to as "opening width"). Thus, the second metal member 140 can stand on its own while tilting within the range of the opening width of the first recessed portion 132. By assembling the first metal member 130 and the second metal member 140 to each other in this way, the self-standing ability of the first metal member 130 and the second metal member 140 can be improved.

Note that the first metal member 130 and the second metal member 140 may be integrally connected to each other by solder or the like in the assembled state.

In the assembled state, the top portion 1313 of the first metal member 130 and the top portion 1413 of the second metal member 140 are flush with each other. Thus, both the contact portion 133 (see FIG. 4) of the first metal member 130 and the contact portion 143 (see FIG. 4) of the second metal member 140 can be in contact with the back surface of the first shield portion 110a of the shield layer 110. "Flush with each other" includes "the top portion 1313 of the first metal member 130 and the top portion 1413 of the second metal member 140 are completely flush with each other" and "there is a slight difference in height between the top portion 1313 of the first metal member 130 and the top portion 1413 of the second metal member 140 (e.g., a difference equivalent to less than 10% of a length in the first metal member 130 in the thickness direction D3).

In the first metal member 130, as in the second metal member 140, the through holes 144 and the connection portions 145 may be provided. In the second metal member 140, as in the first metal member 130, the through holes 144 and the connection portions 145 may be omitted.

(3) Main Effects

As described above, the radio frequency module 1 according to the embodiment includes the mounting board 100, the first electronic component (e.g., the power amplifier 61) and the second electronic component (e.g., the transmit filter 41), the first metal member 130 and the second metal member 140, and the resin layer 120 (resin member). The mounting board 100 has the first main surface 101 and the second main surface 102 facing each other. The first electronic component and the second electronic component are disposed on the first main surface 101 of the mounting board 100. The first metal member 130 and the second metal member 140 are disposed on the first main surface 101 of the mounting board 100. The resin layer 120 covers at least part of the first electronic component, the second electronic component, and the second metal member 140. At least one of the first metal member 130 and the second metal member 140 is electrically grounded. The first metal member 130 has the first longitudinal direction along the first direction D1 in plan view from the thickness direction D3 of the mounting board 100. The second metal member 140 has the second longitudinal direction along the second direction D2 intersecting with the first direction D1 in plan view from the thickness direction D3 of the mounting board 100. One of the first metal member 130 and the second metal member 140 (in the embodiment, the second metal member 140) is placed between the first electronic component and the second electronic component.

According to this configuration, the first recessed portion 132 of the first metal member 130 and the second recessed portion 142 of the second metal member 140 face each other and are in contact with each other. Thus, the first metal member 130 and the second metal member 140 can support each other and stand on their own on the mounting board 100. Accordingly, the self-standing ability of the first metal member 130 or the second metal member 140 placed between the electronic components can be improved.

(4) Modifications

Modifications of the embodiment will be described below. In the following modifications, the same components as those in the embodiment are denoted by the same reference numerals, and descriptions thereof will be omitted. Description will focus on components that are different from those in the embodiment. The embodiment and the modifications described below may be combined and implemented.

(4-1) Modification 1

Figure 8:
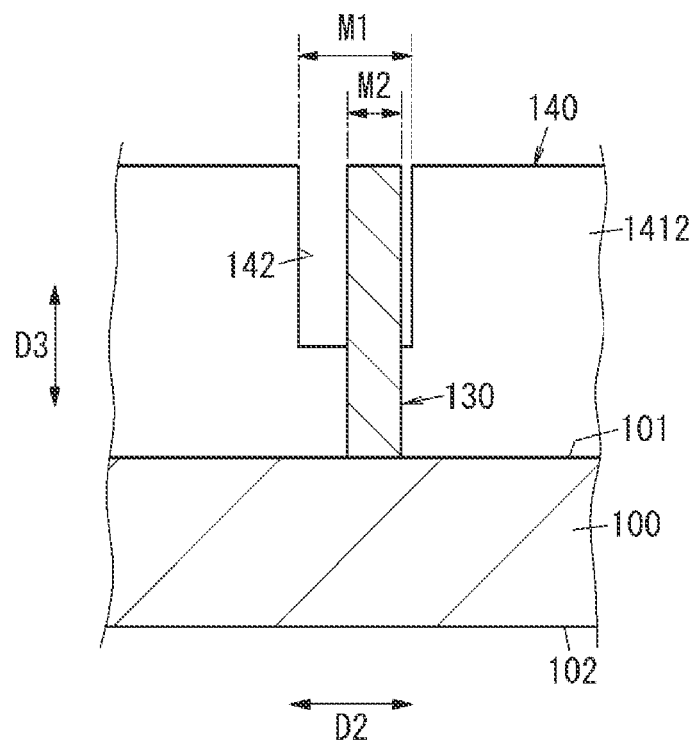
FIG. 8 is an explanatory diagram illustrating a relationship between a width of a second recessed portion of the second metal member and a thickness of the first metal member in Modification 1.

As illustrated in FIG. 8, in Modification 1, in the embodiment, a width M1 in the second recessed portion 142 of the second metal member 140 in the second direction D2 is smaller than twice a thickness M2 (a width in the second direction D2) of the first metal member 130. This suppresses the rattling of the first metal member 130 in the second recessed portion 142 of the second metal member 140.

(4-2) Modification 2

Figure 9:
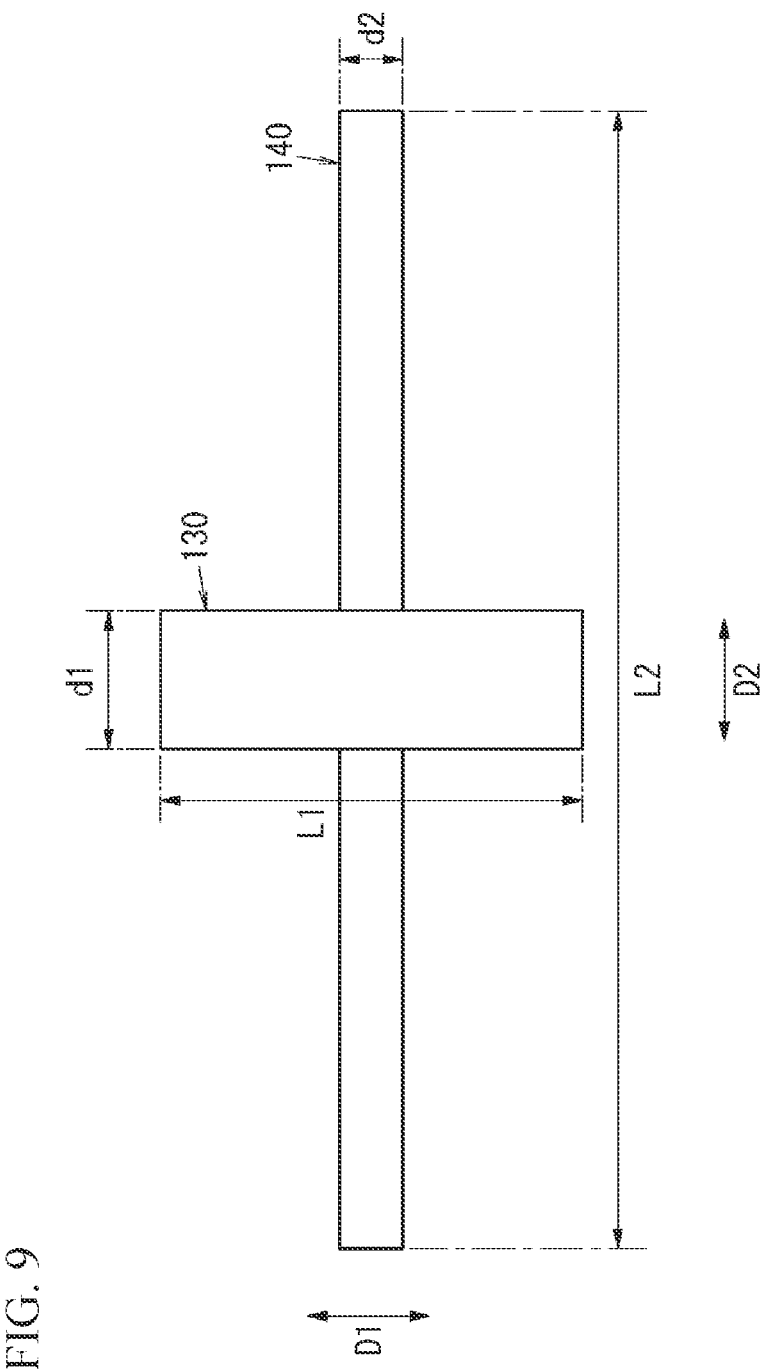
FIG. 9 is a schematic plan view illustrating the first metal member and the second metal member according to Modification 2.

As illustrated in FIG. 9, in the embodiment, a thickness d1 in the first metal member 130 in the second direction D2 and a thickness d2 in the second metal member 140 in the first direction D1 may be different. In other words, the thickness of one of the first metal member 130 and the second metal member 140 (the thickness d2 in FIG. 9) may be thinner than the thickness of another (the thickness d1 in FIG. 9). When the thicknesses of both the first metal member 130 and the second metal member 140 are increased, it is not easy to ensure a mounting area for mounting electronic components on the mounting board 100. However, as in Modification 2, by making the thickness of one of the first metal member 130 and the second metal member 140 thinner than the thickness of the other, the self-standing ability of the first metal member 130 and the second metal member 140 can be improved while ensuring a mounting area for mounting electronic components on the mounting board 100.

In Modification 2, a length L1 of the first metal member 130 is set as a length in the first direction D1 in plan view from the thickness direction D3 of the mounting board 100, and a length L2 of the second metal member 140 is set as a length in the second direction D2 in the plan view. At this time, the length L2 of the second metal member 140 is longer than the length L1 of the first metal member 130. That is, in Modification 2, the thickness d1 of the first metal member 130 having the shorter length is thicker than the thickness d2 of the second metal member 140 having the longer length. Accordingly, the self-standing ability of the first metal member 130 and the second metal member 140 can be further improved while further ensuring a mounting area for mounting electronic components on the mounting board 100.

In Modification 2, the length L1 of the first metal member 130 may be longer than the length L2 of the second metal member 140. In this case, the thickness d2 of the second metal member 140 having the shorter length is thicker than the thickness d1 of the first metal member 130 having the longer length. Also in this case, similar to the case of Modification 2, the self-standing ability of the first metal member 130 and the second metal member 140 can be further improved while further ensuring a mounting area for mounting electronic components on the mounting board 100.

(4-3) Modification 3

Figures 10A, 10B:
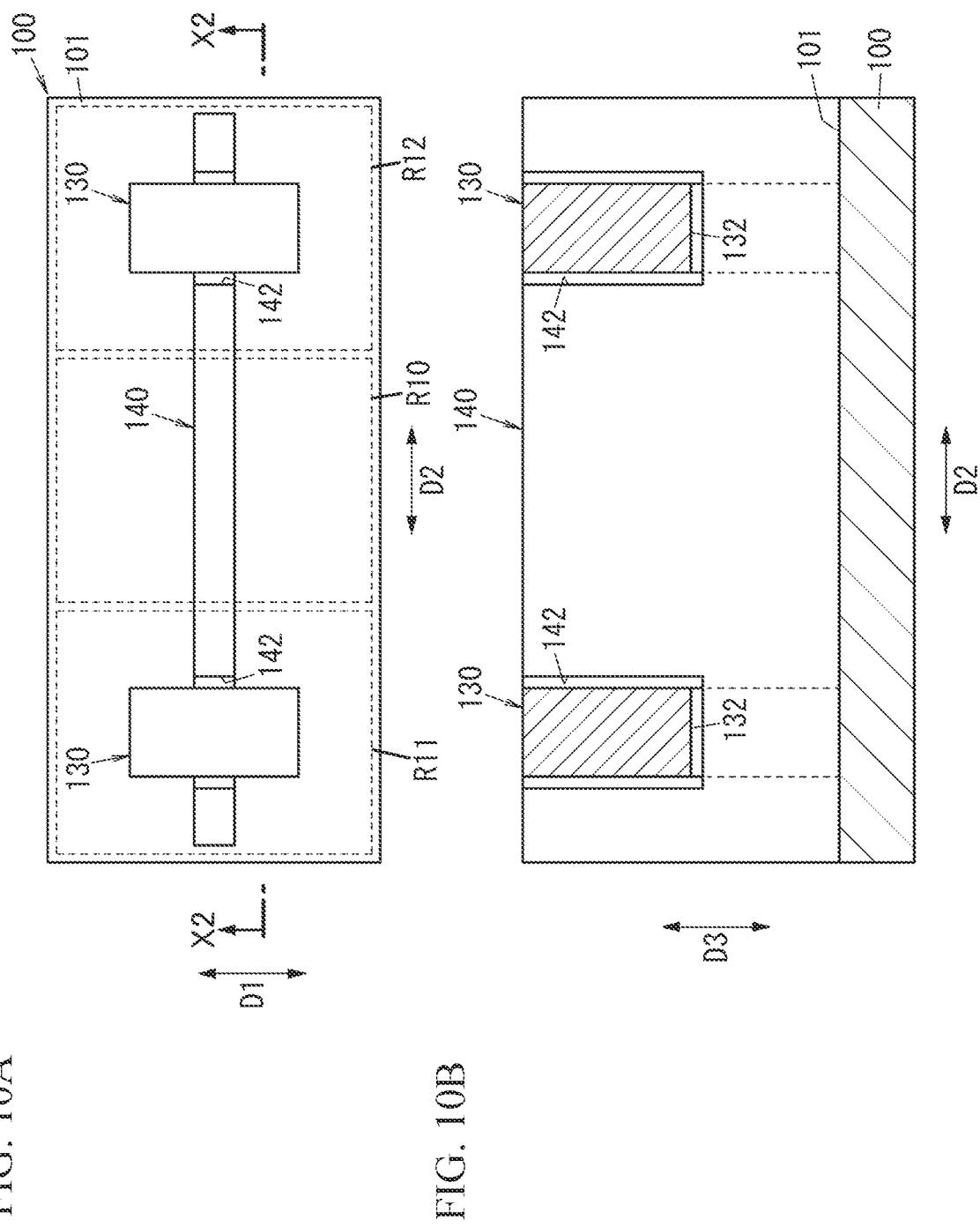
FIG. 10A is a schematic plan view illustrating an example of the arrangement of the first metal member and the second metal member on a mounting board in Modification 3.
FIG. 10B is a sectional view taken along line X2-X2 in FIG. 10A.

As illustrated in FIGS. 10A and 10B, in Modification 3, the second metal member 140 is made to stand on its own by multiple (two in FIGS. 10A and 10B) first metal members 130. Note that the contact portion 133 of the first metal member 130 is omitted in FIGS. 10A and 10B. The contact portion 143, the through holes 144, and the connection portions 145 of the second metal member 140 are not illustrated in FIGS. 10A and 10B.

That is, in Modification 3, the multiple first metal members 130 are provided. In Modification 3, the second metal member 140 includes multiple (two in FIGS. 10A and 10B) second recessed portions 142. The multiple second recessed portions 142 are respectively associated with the multiple first metal members 130. The multiple second recessed portions 142 are spaced apart from each other in the second metal member 140 in the second direction D2. Each of the multiple second recessed portions 142 faces and is in contact with (i.e., fitted to) the first recessed portion 132 of the first metal member 130 associated, of the multiple first metal members 130. With this configuration, the self-standing ability of the first metal members 130 and the second metal member 140 can be further improved. As illustrated in FIG. 10A, in Modification 3, on the first main surface 101, the mounting board 100 has a central region R10, a first region R11, and a second region R12. The central region R10 is, for example, a region located at the center on the first main surface 101 of the mounting board 100 in the second direction D2. The first region R11 is a region located on the first main surface 101 of the mounting board 100 closer to one end side (left end side of the paper) in the second direction D2 than the central region R10. The second region R12 is a region located on the first main surface 101 of the mounting board 100 closer to another end side (right end side of the paper) in the second direction D2 than the central region R10. A width of each of the central region R10, the first region R11, and the second region R12 in the second direction D2 is, for example, one-third of a length (total length) in the mounting board 100 in the second direction D2.

In Modification 3, the second metal member 140 extends in the second direction D2 of the mounting board 100 in plan view from the thickness direction D3 of the mounting board 100. Each of the multiple first metal members 130 extends in the first direction D1 of the mounting board 100 in the plan view. The multiple (two in FIGS. 10A and 10B) first metal members 130 are located in the first region R11 of the mounting board 100 and the second region R12 of the mounting board 100, respectively. Accordingly, since the first metal member 130 is not placed in the central region R10 of the mounting board 100, a mounting area for mounting electronic components can be ensured.

(4-4) Modification 4

Figure 11:
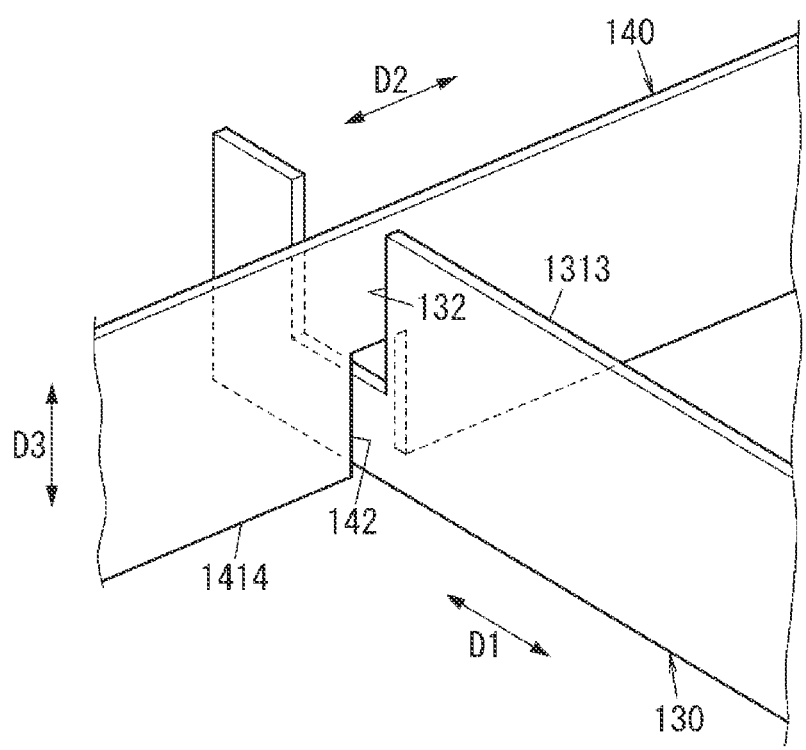
FIG. 11 is a schematic enlarged view illustrating an intersection of the first metal member and the second metal member and its surroundings according to Modification 4.

In the embodiment, as illustrated in FIG. 7, the first recessed portion 132 is provided at the base end portion 1314 of the first metal member 130, and the second recessed portion 142 is provided at the top portion 1413 of the second metal member 140. As illustrated in FIG. 11, the first recessed portion 132 may be provided at the top portion 1313 of the first metal member 130, and the second recessed portion 142 may be provided at the base end portion 1414 of the second metal member 140. Also in this case, the same effects as in the embodiment can be achieved. In FIG. 11, the contact portion 133 in the first metal member 130 is not illustrated, and the contact portion 143, the through holes 144, and the connection portions 145 in the second metal member 140 are not illustrated.

(4-5) Modification 5

Figure 12:
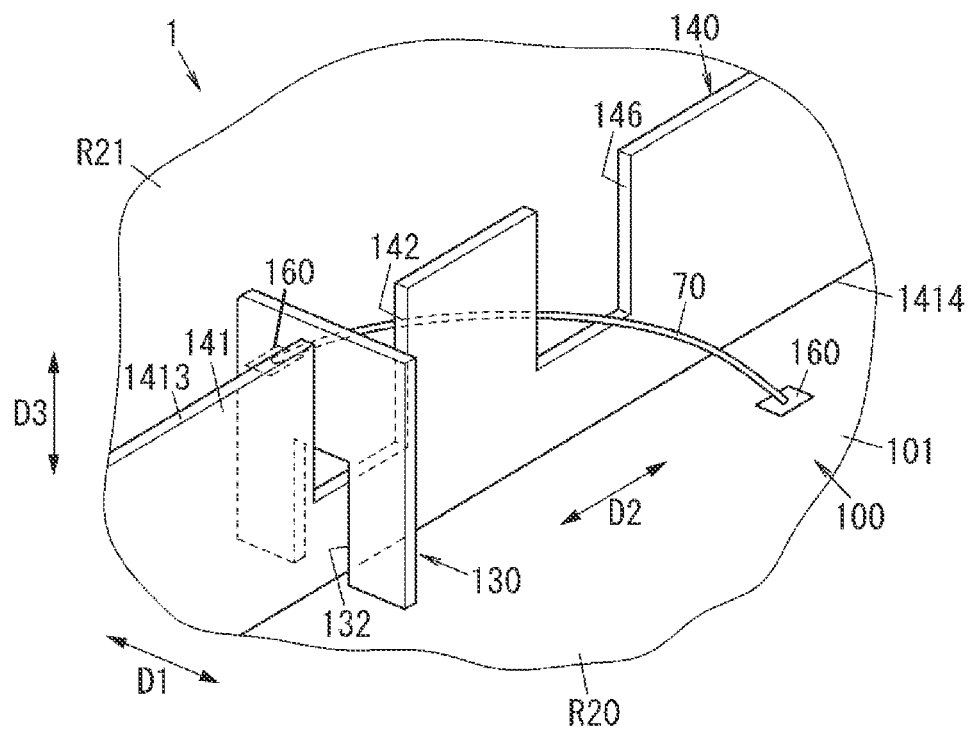
FIG. 12 is a schematic perspective view illustrating an example of wire bonding implementation according to Modification 5.

As illustrated in FIG. 12, the radio frequency module 1 according to Modification 5 further includes one or more (one in FIG. 12) wires 70 for wire bonding in the radio frequency module 1 according to the embodiment. The wire 70 is made of a conductive material (e.g., gold, aluminum, or copper) and is formed to have a diameter of, for example, ten and several micrometers to several hundred micrometers. The wire 70 is mounted on the first main surface 101 of the mounting board 100. The second metal member 140 according to Modification 5 further includes one or more (one in FIG. 12) third recessed portions 146 in the second metal member 140 according to Embodiment 1. The third recessed portion 146 is a passage through which the wire 70 passes in the second metal member 140. The third recessed portion 146 is formed so as to be recessed toward the base end portion 1414 side of the wall portion 141 at the top portion 1413 of the wall portion 141. The third recessed portion 146 is formed so as to pass through the wall portion 141 in the thickness direction (the first direction D1) of the wall portion 141. The third recessed portion 146 has, for example, a rectangular shape in plan view from the thickness direction of the wall portion 141. In Modification 5, the thickness direction of the second metal member 140 is an orthogonal direction (first direction D1) orthogonal to the second direction D2.

The wire 70 is placed across the third recessed portion 146 so as to pass through the inside of the third recessed portion 146. The wire 70 connects the two second pads 160 (conductive portions) on the first main surface 101 of the mounting board 100. The two second pads 160 are provided in regions R20 and R21, respectively on both sides of the second metal member 140 in the first direction D1 on the first main surface 101 of the mounting board 100. In this modification, a case where the wire 70 connects the two second pads 160 (conductive portions) is illustrated. However, the wire 70 may connect the second pad 160 (conductive portion) and an external terminal (conductive portion) of an electronic component, or may connect respective external terminals (conductive portions) of two electronic components.

The second metal member 140 is grounded. Thus, when the two second pads 160 are grounded, the wire 70 may be in contact with the third recessed portion 146. However, when the two second pads 160 are not grounded, the wire 70 needs to be placed so as not to be in contact with the third recessed portion 146.

According to Modification 5, the wire 70 can connect the two second pads 160 (conductive portions) provided in the respective regions on both sides of the second metal member 140 in the first direction D1 on the first main surface 101 of the mounting board 100. At this time, the wire 70 can connect the two second pads 160 with almost no capacitance generated in the ground electrode of the mounting board 100.

(4-6) Modification 6

Figure 13:
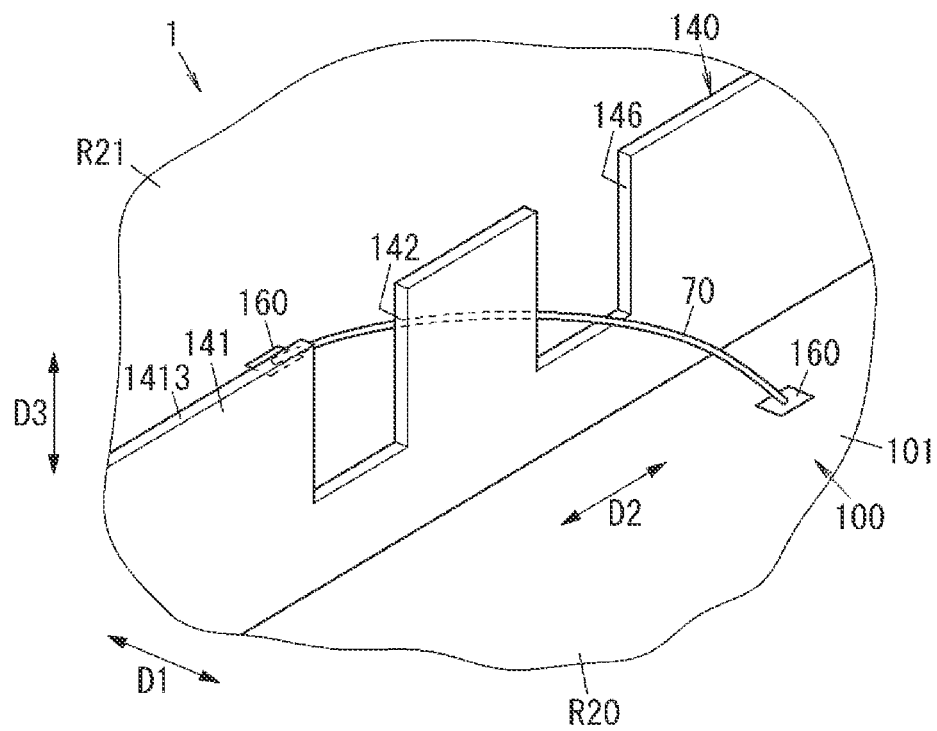
FIG. 13 is a schematic perspective view illustrating an example of wire bonding implementation according to Modification 6.

As illustrated in FIG. 13, Modification 6 differs from Modification 5 in that the first metal member 130 is omitted and the second metal member 140 is made to stand on its own by the wire 70. In this modification, the second recessed portion 142 may be omitted in the second metal member 140. Instead of omitting the second recessed portion 142, the third recessed portion 146 may be omitted and the wire 70 may be placed across the second recessed portion 142. Also in this modification, the self-standing ability of the second metal member 140 can be improved as in the case of the embodiment.

(4-7) Modification 7

Figure 14:
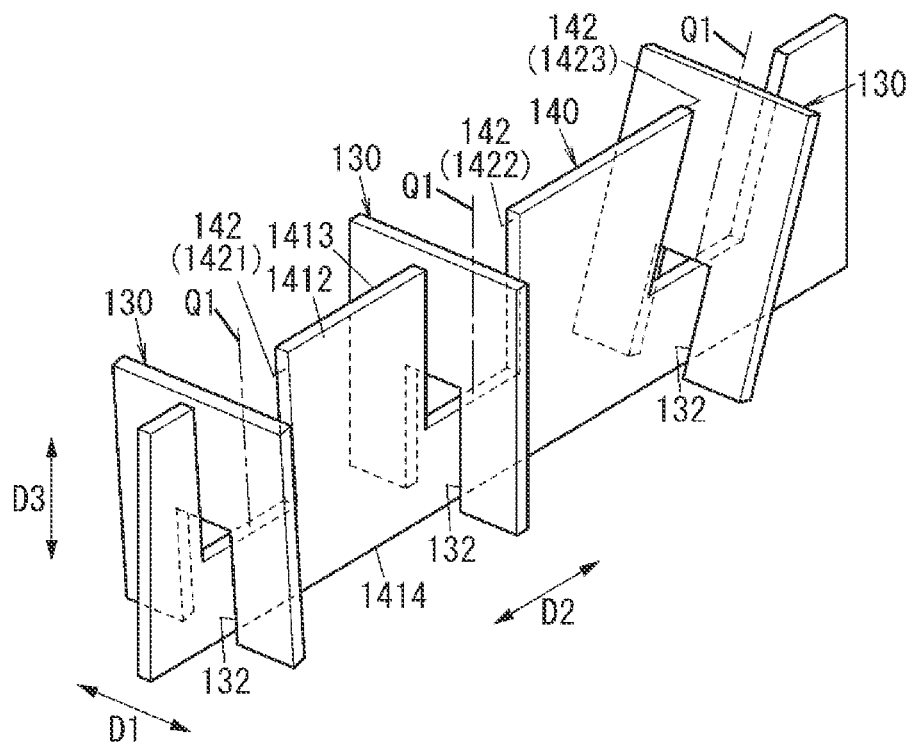
FIG. 14 is a schematic perspective view illustrating first metal members and the second metal member according to Modification 7.

In the embodiment, as illustrated in FIG. 7, a center line Q1 of the second recessed portion 142 is parallel to the lateral direction of a main surface 1412 of the second metal member 140 (the thickness direction D3). As illustrated in FIG. 14, the center line Q1 of the second recessed portion 142 may be inclined with respect to the lateral direction of the main surface 1412 of the second metal member 140 (the thickness direction D3). The center line Q1 of the second recessed portion 142 is a line passing through the center of a width in the second recessed portion 142 in the second direction D2 in a side view from the thickness direction (the first direction D1) of the second metal member 140. That is, the center line Q1 extends along a direction in which the second recessed portion 142 is recessed.

In the example in FIG. 14, the second metal member 140 has three second recessed portions 142 (1421, 1422, and 1423). Among the three second recessed portions 142, the center line Q1 of the middle second recessed portion 1422 is, for example, parallel to the lateral direction of the second metal member 140 (thickness direction D3). Thus, the first metal member 130 to be assembled to the middle second recessed portion 1422 is placed such that a lateral direction of the main surface 1311 is substantially along the center line Q1 of the second recessed portion 1422. Among the three second recessed portions 142, the center line Q1 of the second recessed portion 1421 at one end (left end of the paper) is inclined toward the outer side portion (left side of the paper) in the second direction D2 from the base end portion 1414 side to the top portion 1413 side of the second metal member 140 with respect to the lateral direction of the second metal member 140 (the thickness direction D3) in a side view from the first direction D1, for example. Thus, the first metal member 130 to be assembled to the second recessed portion 1421 at one end is placed inclined to the thickness direction D3 along the center line Q1 of the second recessed portion 1421 in a side view from the first direction D1. Among the three second recessed portions 142, the center line Q1 of the second recessed portion 1423 at another end (right end of the paper) is inclined toward the outer side portion (right side of the paper) in the second direction D2 from the base end portion 1414 side to the top portion 1413 side of the second metal member 140 with respect to the lateral direction of the second metal member 140 (the thickness direction D3) in a side view from the first direction D1. Thus, the first metal member 130 to be assembled to the second recessed portion 1423 at the other end is placed inclined to the thickness direction D3 along the center line Q1 of the second recessed portion 1423 in a side view from the first direction D1.

According to the Modification 7, by inclining the center line Q1 of the second recessed portion 142 in advance, the first metal member 130 can be inclined in a direction in which the center line Q1 of the second recessed portion 142 is inclined in advance when the first metal member 130 is assembled to the second metal member 140. This suppresses the rattling of the first metal member 130 in the second recessed portion 142.

Figure 15:
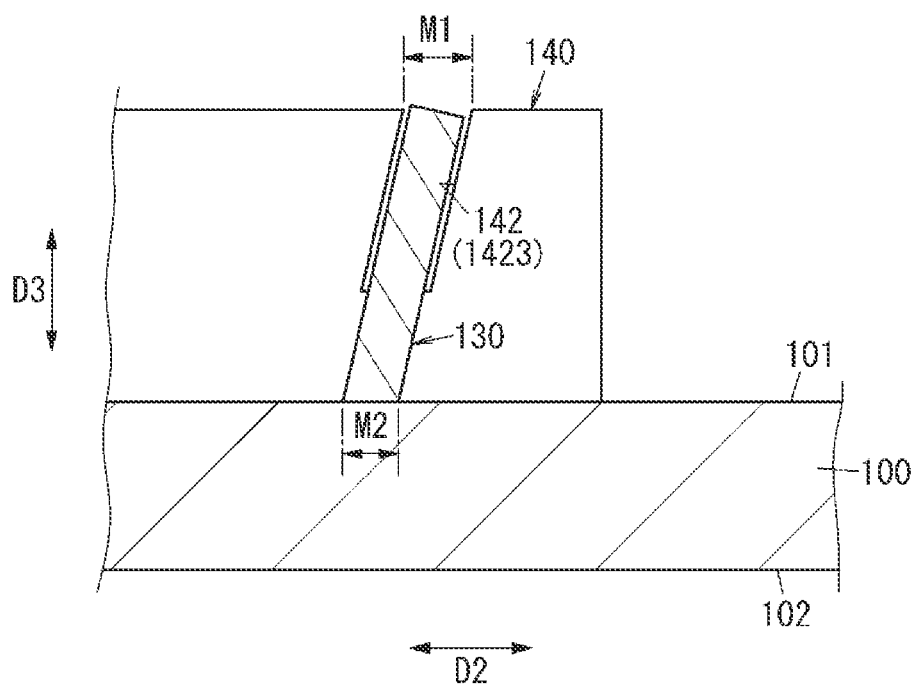
FIG. 15 is an explanatory diagram illustrating a relationship between a width of an inclined second recessed portion and a thickness of the first metal member in a modification of Modification 7.

As illustrated in FIG. 15, in Modification 7, the width M1 of the inclined second recessed portion 142 (e.g., the second recessed portion 1423) in the second direction D2 may be the same size as the width M2 of the first metal member 130 to be assembled to the second recessed portion 1423 in the second direction D2. The "same size" includes "the widths M1 and M2 are exactly the same size", and "the width M2 is slightly smaller than the width M1 (e.g., by an amount less than 10% of the width M1)".

(4-8) Modification 8

In Modification 8, examples (Example 1 to Example 4) of the arrangement of the first metal member 130 and the second metal member 140 on the mounting board 100 will be illustrated. In Example 1, the first metal member 130 or the second metal member 140 may be placed between an output matching circuit (e.g., the matching circuit 51) on the output side of a power amplifier and an acoustic wave filter (e.g., the transmit filter 41, the receive filter 42, or the transmit/receive filter). This can ensure the isolation between the output matching circuit and the acoustic wave filter.

In Example 2, the first metal member 130 or the second metal member 140 may be placed between multiple acoustic wave filters (e.g., the transmit filter 41 and the receive filter 42). This can ensure the isolation between the multiple acoustic wave filters.

In Example 3, the first metal member 130 or the second metal member 140 may be placed between electronic components for which the isolation is to be ensured when transmitting or receiving simultaneously using two or more communication bands. This can ensure the isolation between electronic components for which the isolation is to be ensured when transmitting or receiving simultaneously using two or more communication bands.

In Example 4, the first metal member 130 or the second metal member 140 may be placed between both a wire connected to the antenna terminal 10 and a matching circuit and other electronic components. This can ensure the isolation between both the wire connected to the antenna terminal 10 and the matching circuit and the other electronic components.

(4-9) Modification 9

In the embodiment, both the first metal member 130 and the second metal member 140 are in contact with the first shield portion 110a (see FIG. 2) of the shield layer 110. However, only one of the first metal member 130 and the second metal member 140 may be in contact with the first shield portion 110a of the shield layer 110, or neither the first metal member 130 nor the second metal member 140 needs be in contact with the first shield portion 110a of the shield layer 110.

(5) Summary

A radio frequency module (1) according to a first aspect includes a mounting board (100), a first electronic component (e.g., a power amplifier 61) and a second electronic component (e.g., a transmit filter 41), a first metal member (130) and a second metal member (140), and a resin member (120). The mounting board (100) has a first main surface (101) and a second main surface (102) facing each other. The first electronic component (e.g., the power amplifier 61) and the second electronic component (e.g., the transmit filter 41) are disposed on the first main surface (101) of the mounting board (100). The first metal member (130) and the second metal member (140) are disposed on the first main surface (101) of the mounting board (100). The resin member (120) covers at least part of the first electronic component (e.g., the power amplifier 61), the second electronic component (e.g., the transmit filter 41), and the second metal member (140). At least one of the first metal member (130) and the second metal member (140) is grounded. The first metal member (130) has a first longitudinal direction along a first direction (D1) in plan view from a thickness direction (D3) of the mounting board (100). The second metal member (140) has a second longitudinal direction along a second direction (D2) intersecting with the first direction (D1) in the plan view. At least one of the first metal member (130) and the second metal member (140) is placed between the first electronic component (e.g., the power amplifier 61) and the second electronic component (e.g., the transmit filter 41). The first metal member (130) has a first recessed portion (132). The second metal member (140) has a through hole (144) and a second recessed portion (142). The through hole (144) passes through the second metal member (140) in the direction (D1) intersecting with the second direction (D2). The second recessed portion (142) faces and is in contact with the first recessed portion (132).

According to this configuration, the first recessed portion (132) of the first metal member (130) and the second recessed portion (142) of the second metal member (140) face each other and are in contact with each other. Thus, the first metal member (130) and the second metal member (140) can support each other and stand on their own on the first main surface (101) of the mounting board (100). Accordingly, the self-standing ability of the first metal member (130) or the second metal member (140) placed between the electronic components can be improved.

In addition, the through hole (144) allows air to pass therethrough when reflow-connecting the second metal member (140) to the mounting board (100). The through hole (144) allows a liquid material, which is a material of the resin member (120), to pass therethrough when the liquid material is applied to the mounting board (100) before curing. Passage of the air and the liquid material through the through hole (144) prevents the second metal member (140) from tilting or falling down due to the flow of the air and the liquid material.

In the radio frequency module (1) according to a second aspect, in the first aspect, in plan view from the thickness direction (D3) of the mounting board (100), a thickness (d1) in the first metal member (130) in the direction (D2) orthogonal to the first direction (D1) is different from a thickness (d2) in the second metal member (140) in the direction (D1) orthogonal to the second direction (D2).

According to this configuration, the self-standing ability of the first metal member (130) and the second metal member (140) can be improved while ensuring a mounting area for mounting electronic components (including the first electronic component (e.g., the power amplifier 61) and the second electronic component (e.g., the transmit filter 41)) on the mounting board (100).

In the radio frequency module (1) according to a third aspect, in the second aspect, a length (L2) in the second metal member (140) in the second direction (D2) is longer than a length (L1) in the first metal member (130) in the first direction (D1). The thickness (d1) of the first metal member (130) is thicker than the thickness (d2) of the second metal member (140).

According to this configuration, the self-standing ability of the first metal member (130) and the second metal member (140) can be further improved while further ensuring a mounting area for mounting electronic components (including the first electronic component (e.g., the power amplifier 61) and the second electronic component (e.g., the transmit filter 41)) on the mounting board (100).

In the radio frequency module (1) according to a fourth aspect, in the second aspect, a length (L1) in the first metal member (130) in the first direction (D1) is longer than a length (L2) in the second metal member (140) in the second direction (D2). The thickness (d2) of the second metal member (140) is thicker than the thickness (d1) of the first metal member (130).

According to this configuration, the self-standing ability of the first metal member (130) and the second metal member (140) can be further improved while further ensuring a mounting area for mounting electronic components (including the first electronic component (e.g., the power amplifier 61) and the second electronic component (e.g., the transmit filter 41)) on the mounting board (100).

The radio frequency module (1) according to a fifth aspect, in any one of the first to fourth aspects, further includes one or more first metal members (130). The second metal member (140) further has one or more second recessed portions (142). The multiple second recessed portions (142) are respectively associated with the multiple first metal members (130). The multiple second recessed portions (142) are spaced apart from each other in the second direction (D2) in the second metal member (140). Each of the multiple second recessed portions (142) faces and is in contact with the first recessed portion (132) of the first metal member (130) associated, of the multiple first metal members (130).

According to this configuration, the second metal member (140) is supported by the multiple first metal members (130), so that the self-standing ability of the second metal member (140) can be further improved.

In the radio frequency module (1) according to a sixth aspect, in the fifth aspect, on the first main surface (101), the mounting board (100) has a central region (R10), a first region (R11), and a second region (R12). The first region R11 and the second region R12 are respectively located on both sides of the central region R10 in the second direction D2. The multiple first metal members (130) are located in the first region (R11) and the second region (R12), respectively.

According to this configuration, a mounting area for mounting electronic components (including the first electronic component (e.g., the power amplifier 61) and the second electronic component (e.g., the transmit filter 41)) can be ensured in the central region (R10) on the first main surface (101) of the mounting board (100).

The radio frequency module (1) according to a seventh aspect, in any one of the first to sixth aspects, further includes a wire (70) configured to connect two conductive portions (160) respectively provided in regions (R20 and R21) on both sides of the second metal member (140) on the first main surface (101) of the mounting board (100). The second metal member (140) has a third recessed portion (146) passing through the second metal member (140) in the direction (the first direction D1) orthogonal to the second direction (D2). The wire (70) connects the two conductive portions (160) across the third recessed portion (146).

According to this configuration, the wire (70) can connect the two conductive portions (160) respectively provided in the regions on both sides of the second metal member (140) on the first main surface (101) of the mounting board (100). In addition, the wire (70) can connect the two conductive portions (160) with almost no capacitance generated in a ground electrode of the mounting board (100).

In the radio frequency module (1) according to an eighth aspect, in any one of the first to seventh aspects, the resin member (120) covers the first main surface (101) of the mounting board (100).

According to this configuration, in a structure in which the resin member (120) covers the first main surface (101) of the mounting board (100), the self-standing ability of the first metal member (130) and the second metal member (140) can be improved.

The radio frequency module (1) according to a ninth aspect, in any one of the first to eighth aspects, further includes a third electronic component (e.g., a low noise amplifier 62) placed on the first main surface (101) of the mounting board (100). Another of the first metal member (130) and the second metal member (140) is placed between the first electronic component (e.g., the power amplifier 61) and the third electronic component (e.g., the low noise amplifier 62).

According to this configuration, the first metal member (130) can ensure the isolation between the first electronic component (e.g., the power amplifier 61) and the third electronic component (e.g., the low noise amplifier 62).

The radio frequency module (1) according to a 10th aspect, in any one of the first to ninth aspects, further includes a shield layer (110). The shield layer (110) is provided on a main surface (121) in the resin member (120) on the side opposite to the mounting board (100) side and on a outer surface (123) of the resin member (120). At least one of the first metal member (130) and the second metal member (140) is in contact with the shield layer (110). According to this configuration, at least one of the first metal member (130) and the second metal member (140) can be electrically grounded via the shield layer (110).

In the radio frequency module (1) according to an 11th aspect, in the 10th aspect, the shield layer (110) has a first shield portion (110a) provided on the main surface in the resin member (120) on the side opposite to the mounting board (100) side. At least one of the first metal member (130) and the second metal member (140) is in contact with the first shield portion (110a).

According to this configuration, at least one of the first metal member (130) and the second metal member (140) can be in contact with the shield layer (110) at the first shield portion (110a).

A communication device (500) of a 12th aspect includes the radio frequency module (1) according to any one of the first to 11th aspects, and a signal processing circuit (501). The signal processing circuit (501) processes a radio frequency signal passing through the radio frequency module (1).

According to this configuration, the communication device (500) including the radio frequency module (1) having the above-described effects can be provided.

1 RADIO FREQUENCY MODULE
10 ANTENNA TERMINAL
20 SWITCH
21 COMMON TERMINAL
22, 23 SELECTION TERMINAL
31 FIRST MATCHING CIRCUIT
32 SECOND MATCHING CIRCUIT
41 TRANSMIT FILTER
42 RECEIVE FILTER
51 THIRD MATCHING CIRCUIT
51 MATCHING CIRCUIT
52 FOURTH MATCHING CIRCUIT
61 POWER AMPLIFIER
62 LOW NOISE AMPLIFIER
70 WIRE
71 SIGNAL INPUT TERMINAL
72 SIGNAL OUTPUT TERMINAL
100 MOUNTING BOARD
101 FIRST MAIN SURFACE
102 SECOND MAIN SURFACE
103 OUTER SURFACE
110 SHIELD LAYER
110a FIRST SHIELD PORTION
110b SECOND SHIELD PORTION
120 RESIN LAYER (RESIN MEMBER)
121 FIRST MAIN SURFACE
123 OUTER SURFACE
130 FIRST METAL MEMBER
131 WALL PORTION
132 FIRST RECESSED PORTION
133 CONTACT PORTION
140 SECOND METAL MEMBER
141 WALL PORTION
142 SECOND RECESSED PORTION
143 CONTACT PORTION
144 THROUGH HOLE
145 CONNECTION PORTION
146 THIRD RECESSED PORTION
150 to 152 FIRST PAD
160 SECOND PAD (CONDUCTIVE PORTION)
161, 163 SECOND PAD
180 VIA CONDUCTOR
200 EXTERNAL CONNECTION TERMINAL
201 GROUND TERMINAL
202 GROUND TERMINAL
500 COMMUNICATION DEVICE
501 SIGNAL PROCESSING CIRCUIT
502 RF SIGNAL PROCESSING CIRCUIT
503 BASEBAND SIGNAL PROCESSING CIRCUIT
510 ANTENNA
1311 MAIN SURFACE
1312 MAIN SURFACE
1313 TOP PORTION
1314 BASE END PORTION
1331 FIRST MAIN SURFACE
1411 MAIN SURFACE
1412 MAIN SURFACE
1413 TOP PORTION
1414 BASE END PORTION
1421 to 1423 SECOND RECESSED PORTION
1431 FIRST MAIN SURFACE
d1 THICKNESS
d2 THICKNESS
D1 FIRST DIRECTION
D2 SECOND DIRECTION
D3 THICKNESS DIRECTION
L1 LENGTH
L2 LENGTH
M1, M2 WIDTH
Q1 CENTER LINE
R1 to R3, R20, R21 REGION
R10 CENTRAL REGION
R11 FIRST REGION
R12 SECOND REGION

The invention claimed is:

1. A radio frequency module comprising:
a mounting board having a first main surface and a second main surface facing each other;
a first electronic component and a second electronic component disposed on the first main surface of the mounting board;

at least one first metal member and a second metal member disposed on the first main surface of the mounting board; and
a resin member covering at least part of the first electronic component, the second electronic component, and the second metal member,
wherein the first metal member and the second metal member are grounded,
the first metal member has a first longitudinal direction along a first direction in plan view from a thickness direction of the mounting board,
the second metal member has a second longitudinal direction along a second direction intersecting with the first direction in plan view from the thickness direction of the mounting board,
at least one of the first metal member and the second metal member is placed between the first electronic component and the second electronic component,
the first metal member has a first recessed portion, and
the second metal member has
  a through hole passing through the second metal member in a direction intersecting with the second direction, and
  at least one second recessed portion facing and in contact with the first recessed portion.

2. The radio frequency module according to claim 1, wherein in plan view from the thickness direction of the mounting board, a thickness of the first metal member in a direction orthogonal to the first direction is different from a thickness of the second metal member in a direction orthogonal to the second direction.

3. The radio frequency module according to claim 2, wherein a length of the second metal member in the second direction is longer than a length of the first metal member in the first direction, and
the thickness of the first metal member is thicker than the thickness of the second metal member.

4. The radio frequency module according to claim 2, wherein a length of the first metal member in the first direction is longer than a length of the second metal member in the second direction, and
the thickness of the second metal member is thicker than the thickness of the first metal member.

5. The radio frequency module according to claim 1, wherein,
the first metal member comprises a plurality of first metal members,
the second recessed portion comprises a plurality of second recessed portions, and
the plurality of second recessed portions are respectively associated with the plurality of first metal members, and are spaced apart from each other in the second direction in the second metal member, and
each of the plurality of second recessed portions faces and is in contact with the first recessed portion of a corresponding one of the plurality of first metal members.

6. The radio frequency module according to claim 5, wherein the first main surface of the mounting board comprises
  a central region, and
  a first region and a second region respectively located on both sides of the central region in the second direction, and
the plurality of first metal members are respectively located
  in the first region, and
  in the second region.

7. The radio frequency module according to claim 1, further comprising:
a wire configured to connect two conductive portions respectively provided in regions on both sides of the second metal member on the first main surface of the mounting board,
wherein the second metal member has a third recessed portion passing through the second metal member in a direction orthogonal to the second direction, and
the wire connects the two conductive portions across the third recessed portion.

8. The radio frequency module according to claim 1, wherein the resin member covers the first main surface of the mounting board.

9. The radio frequency module according to claim 1, further comprising:
a third electronic component placed on the first main surface of the mounting board,
wherein another of the first metal member and the second metal member is placed between the first electronic component and the third electronic component.

10. The radio frequency module according to claim 1, further comprising:
a shield layer provided on a main surface in the resin member on a side opposite to a mounting board side and on a side surface of the resin member,
wherein at least one of the first metal member and the second metal member is in contact with the shield layer.

11. The radio frequency module according to claim 10, wherein the shield layer has a first shield portion provided on the main surface in the resin member on the side opposite to the mounting board side, and
at least one of the first metal member and the second metal member is in contact with the first shield portion.

12. A communication device comprising:
the frequency module according to claim 1; and
a signal processing circuit configured to process a radio frequency signal passing through the radio frequency module.

13. The radio frequency module according to claim 2, wherein,
the first metal member comprises a plurality of first metal members,
the second recessed portion comprises a plurality of second recessed portions, and
the plurality of second recessed portions are respectively associated with the plurality of first metal members, and are spaced apart from each other in the second direction in the second metal member, and
each of the plurality of second recessed portions faces and is in contact with the first recessed portion of a corresponding one of the plurality of first metal members.

14. The radio frequency module according to claim 3, wherein,
the first metal member comprises a plurality of first metal members,
the second recessed portion comprises a plurality of second recessed portions, and
the plurality of second recessed portions are respectively associated with the plurality of first metal members, and are spaced apart from each other in the second direction in the second metal member, and
each of the plurality of second recessed portions faces and is in contact with the first recessed portion of a corresponding one of the plurality of first metal members.

15. The radio frequency module according to claim 4, wherein, the first metal member comprises a plurality of first metal members, the second recessed portion comprises a plurality of second recessed portions, and the plurality of second recessed portions are respectively associated with the plurality of first metal members, and are spaced apart from each other in the second direction in the second metal member, and each of the plurality of second recessed portions faces and is in contact with the first recessed portion of a corresponding one of the plurality of first metal members.

16. The radio frequency module according to claim 2, further comprising:

a wire configured to connect two conductive portions respectively provided in regions on both sides of the second metal member on the first main surface of the mounting board, wherein the second metal member has a third recessed portion passing through the second metal member in a direction orthogonal to the second direction, and the wire connects the two conductive portions across the third recessed portion.

17. The radio frequency module according to claim 3, further comprising:

a wire configured to connect two conductive portions respectively provided in regions on both sides of the second metal member on the first main surface of the mounting board, wherein the second metal member has a third recessed portion passing through the second metal member in a direction orthogonal to the second direction, and the wire connects the two conductive portions across the third recessed portion.

18. The radio frequency module according to claim 4, further comprising:

a wire configured to connect two conductive portions respectively provided in regions on both sides of the second metal member on the first main surface of the mounting board, wherein the second metal member has a third recessed portion passing through the second metal member in a direction orthogonal to the second direction, and the wire connects the two conductive portions across the third recessed portion.

19. The radio frequency module according to claim 5, further comprising:

a wire configured to connect two conductive portions respectively provided in regions on both sides of the second metal member on the first main surface of the mounting board, wherein the second metal member has a third recessed portion passing through the second metal member in a direction orthogonal to the second direction, and the wire connects the two conductive portions across the third recessed portion.

20. The radio frequency module according to claim 6, further comprising:

a wire configured to connect two conductive portions respectively provided in regions on both sides of the second metal member on the first main surface of the mounting board, wherein the second metal member has a third recessed portion passing through the second metal member in a direction orthogonal to the second direction, and the wire connects the two conductive portions across the third recessed portion.

* * * * *